United States Patent
Ko et al.

(10) Patent No.: US 11,048,370 B2
(45) Date of Patent: Jun. 29, 2021

(54) DISPLAY DEVICE AND METHOD OF MANUFACTURING THE SAME

(71) Applicant: Samsung Display Co., Ltd., Yongin-si (KR)

(72) Inventors: Gun Woo Ko, Yongin-si (KR); Won Mo Park, Yongin-si (KR); Hye Kyung Park, Yongin-si (KR)

(73) Assignee: Samsung Display Co., Ltd.

( * ) Notice: Subject to any disclaimer, the term of this patent is extended or adjusted under 35 U.S.C. 154(b) by 82 days.

(21) Appl. No.: 15/816,066

(22) Filed: Nov. 17, 2017

(65) Prior Publication Data

US 2018/0188849 A1    Jul. 5, 2018

(30) Foreign Application Priority Data

Dec. 29, 2016 (KR) ................. 10-2016-0182697

(51) Int. Cl.
  G06F 3/041    (2006.01)
  G09G 3/36     (2006.01)
  G06F 3/044    (2006.01)
  H01L 27/32    (2006.01)

(52) U.S. Cl.
  CPC .......... *G06F 3/0447* (2019.05); *G06F 3/0412* (2013.01); *G06F 3/0443* (2019.05); *G06F 3/0446* (2019.05); *H01L 27/323* (2013.01); *H01L 27/3272* (2013.01); *G06F 2203/04103* (2013.01); *G06F 2203/04105* (2013.01); *G06F 2203/04106* (2013.01)

(58) Field of Classification Search
  CPC ........... G09G 3/36; G06F 3/041; G06F 3/045; G01R 27/26; G06K 11/06; G08C 21/00
  See application file for complete search history.

(56) References Cited

U.S. PATENT DOCUMENTS

| | | | |
|---|---|---|---|
| 8,723,813 B2 | 5/2014 | Park et al. | |
| 9,024,907 B2 | 5/2015 | Bolender | |
| 2004/0109102 A1* | 6/2004 | Chang | G02F 1/134336 349/44 |
| 2007/0013856 A1* | 1/2007 | Watanabe | G02F 1/13452 349/150 |
| 2009/0135151 A1 | 5/2009 | Sun | |
| 2010/0060590 A1* | 3/2010 | Wilson | G06F 3/0418 345/173 |
| 2011/0175845 A1 | 7/2011 | Honda et al. | |

(Continued)

FOREIGN PATENT DOCUMENTS

| | | |
|---|---|---|
| EP | 2759917 A2 | 7/2014 |
| EP | 2937766 A1 | 10/2015 |
| WO | 2016/089186 A1 | 6/2016 |

OTHER PUBLICATIONS

Extended European Search Report dated May 29, 2018, 8 Pages.

*Primary Examiner* — Pegeman Karimi
(74) *Attorney, Agent, or Firm* — Innovation Counsel LLP

(57) ABSTRACT

There is provided a display device. The display device includes a display panel for displaying an image on a front surface thereof and a pressure sensor disposed on a rear surface of the display panel to sense touch pressure of a user. The pressure sensor includes a first sensing electrode and a second sensing electrode insulated from each other to form capacitance. The first sensing electrode is printed onto the rear surface of the display panel.

29 Claims, 20 Drawing Sheets

(56) References Cited

U.S. PATENT DOCUMENTS

| | | | |
|---|---|---|---|
| 2015/0070309 A1* | 3/2015 | Kang | G06F 3/044 |
| | | | 345/174 |
| 2015/0185887 A1 | 7/2015 | Park et al. | |
| 2016/0098110 A1 | 4/2016 | Choi et al. | |
| 2016/0139716 A1* | 5/2016 | Filiz | G06F 3/0414 |
| | | | 345/174 |
| 2016/0282661 A1* | 9/2016 | Nam | G02F 1/133305 |
| 2016/0349907 A1 | 12/2016 | Kobayashi et al. | |
| 2017/0220163 A1* | 8/2017 | Kurasawa | G02F 1/13338 |
| 2018/0101258 A1* | 4/2018 | Cho | G06F 3/044 |
| 2018/0150153 A1* | 5/2018 | Yoon | G06F 3/041 |
| 2018/0188849 A1* | 7/2018 | Ko | G06F 3/0414 |
| 2018/0348943 A1* | 12/2018 | Yoon | G06F 3/044 |
| 2019/0004630 A1* | 1/2019 | Han | H01L 27/124 |
| 2019/0196639 A1* | 6/2019 | Mugiraneza | G06F 3/044 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2016-0182697, filed on Dec. 29, 2016, in the Korean Intellectual Property Office, the entire contents of which are incorporated herein by reference in their entirety.

BACKGROUND

1. Field

An embodiment of the present disclosure relates to a display device and a method of manufacturing the same, and more particularly, to a display device including a touch sensor and a method of manufacturing the same.

2. Description of the Related Art

As interests in information displays and demands on using portable information media increase, researches and commercialization on display devices are actively performed.

Recent display devices include touch sensors for receiving touches of users as well as image displaying functions. Therefore, users may more conveniently use the display devices through the touch sensors.

In addition, recently, various functions are provided to the users by using touch pressures as well as touch positions.

SUMMARY

An embodiment of the present disclosure relates to a thin display device having a sensor for sensing a touch position and touch pressure and a method of manufacturing the same.

A display device according to an embodiment of the present disclosure includes a display panel for displaying an image on a front surface thereof and a pressure sensor disposed on a rear surface of the display panel to sense touch pressure of a user. The pressure sensor includes a first sensing electrode and a second sensing electrode insulated from each other to form capacitance. The first sensing electrode is printed onto the rear surface of the display panel.

The pressure sensor further includes a protective layer printed onto the first sensing electrode.

The display panel includes a first area in which the first sensing electrode is disposed and a second area in which the first sensing electrode is not disposed. The protective layer in the first area protrudes from a rear surface of the display panel than the protective layer in the second area.

The display device further includes a window disposed on a front surface of the display panel and an adhesive layer disposed between the display panel and the window. The adhesive layer is convex in the first direction to correspond to the second area. The adhesive layer has different thicknesses in the first area and the second area. The thickness of the adhesive layer in the second area is larger than the thickness of the adhesive layer in the first area.

The second sensing electrode is a lower cover that accommodates the display panel.

The display device further includes a buffer member disposed between the first sensing electrode and the lower cover.

The display device further includes a position sensor disposed on the front surface of the display panel to sense a touch position. The position sensor includes sensing electrodes disposed on the front surface of the display panel and a wiring line connected to the sensing electrodes.

The display device further includes a flexible printed circuit board (FPCB) having one end connected to the pressure sensor and the other end connected to the position sensor.

The pressure sensor further includes a pad disposed on the rear surface of the display panel and connected to the sensing electrode. The pad is connected to the other end of the FPCB through a conductive adhesive member.

The display panel includes a display area in which an image is displayed and a non-display area provided at least at one side of the display area. In a plan view, at least a portion of the pad overlaps the display area.

The display device further includes a main FPCB connected to the display panel. The main FPCB and the FPCB are connected to each other.

The display panel includes a substrate and pixels arranged on the substrate. The first sensing electrode is printed onto the rear surface of the substrate.

The display device further includes a light blocking layer disposed between the substrate and the first sensing electrode to prevent external light from being reflected.

The light blocking layer is disposed on an entire surface of the rear surface of the substrate. The light blocking layer is disposed in a position in which the first sensing electrode is provided.

The display device further includes a filling layer disposed in a position in which the first sensing electrode is not provided. The filling layer may be a dummy pattern separate from the first sensing electrode and formed of the same material as the first sensing electrode.

The first sensing electrode includes at least one among metal paste, metal oxide paste, conductive carbon paste, and conductive polymeric paste. The metal paste includes at least one among silver (Ag), copper (Cu), and nickel (Ni). The metal oxide paste includes at least one among zinc oxide (ZnO), tin oxide (SnO), and indium oxide (InO). The conductive carbon paste includes at least one among graphite, carbon fiber, carbon nano-fiber, carbon nano-tube, and graphene, and the conductive polymer is polythiophene-based polymer or polypyrole-based polymer.

The first sensing electrode is mesh-shaped in a plan view.

The first sensing electrode includes a first sub-electrode and a second sub-electrode provided in different areas.

The display device according to an embodiment of the present disclosure may be manufactured by providing a display panel, printing a first sensing electrode onto a rear surface of the display panel, printing a protective layer onto the first sensing electrode, and accommodating the display panel in a lower cover.

The method further includes, after printing the protective layer, attaching a window onto the front surface of the display panel with an adhesive layer interposed between the display panel and the window.

The method further includes cutting of the display panel to which the window is attached by a unit substrate and assembling a lower cover with the cut display panel.

The method further includes printing a light blocking layer between the rear surface of the display panel and the sensing electrode.

The method further includes pressing and printing the sensing electrode onto the light blocking layer. The method further includes forming a filling layer in an area in which the sensing electrode is not formed. The method further includes polishing the protective layer.

A display device according to an embodiment of the present disclosure includes a display panel for displaying an image, the display panel including a front surface through which the image is displayed and a rear surface opposing the front surface, and a pressure sensor disposed on the rear surface of the display panel to sense touch pressure of a user. The pressure sensor includes a first sensing electrode and a protective layer disposed on the first sensing electrode, and a height difference of the protective layer from the rear surface of the display panel is less than a thickness of the first sensing electrode.

The display device may further include a filling layer filling a gap between adjacent first sensing electrodes.

A thickness of the filling layer may be substantially the same as that of the first sensing electrode.

The display device may further include dummy electrode disposed between adjacent first sensing electrodes. The dummy electrode may be electrically insulated from the adjacent first sensing electrodes.

A thickness of the dummy electrode may be substantially the same as that of the first sensing electrode and the dummy electrode and the first sensing electrode may be made of the same material.

The display device may further include a light blocking layer disposed between the display panel and the first sensing electrode, the light blocking layer including a recess portion formed in a region corresponding to the first sensing electrode. The first sensing electrode may be disposed in the recess portion.

A thickness of the first sensing electrode may be substantially the same as a depth of the recess portion.

In the display device according to an embodiment of the present disclosure, it is possible to sense a position and pressure of a touch and to implement a thin display device by a simple method. In addition, it is possible to prevent a partial pattern in the display device from being recognized by the eyes of a user.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The present disclosure may be modified variably and may have various embodiments, particular examples of which will be illustrated in drawings and described in detail. However, it is to be understood that the present disclosure is not limited to a specific disclosed form, but includes all modifications, equivalents, and substitutions without departing from the scope and spirit of the present disclosure.

In describing drawings, like numbers refer to like elements. In the accompanying drawings, dimensions of structures are exaggerated to clarify the present disclosure. While terms such as "first" and "second," etc., may be used to describe various elements, such elements must not be understood as being limited to the above terms. The above terms are used only to distinguish one component from another. For example, a first component may be referred to as a second component without departing from the scope of rights of the present disclosure, and likewise a second component may be referred to as a first component. As used herein, the singular forms "a", "an" and "the" are intended to include the plural forms as well, unless the context clearly indicates otherwise.

In the present application, it is to be understood that the terms such as "including" or "having," etc., are intended to indicate the existence of the features, numbers, operations, actions, elements, parts, or combinations thereof disclosed in the specification, and are not intended to preclude the possibility that one or more other features, numbers, operations, actions, elements, parts, or combinations thereof may exist or may be added. In addition, it will be understood that when an element such as a layer, a film, an area, or a substrate is referred to as being "on" another element, it can be directly on the other element or intervening elements may also be present. Conversely, it will be understood that when an element such as a layer, a film, an area, or a substrate is referred to as being "beneath" another element, it can be directly on the other element or intervening elements may also be present.

Hereinafter, embodiments of the present disclosure will be described in more detail with reference to the accompanying drawings.

Figure 1:
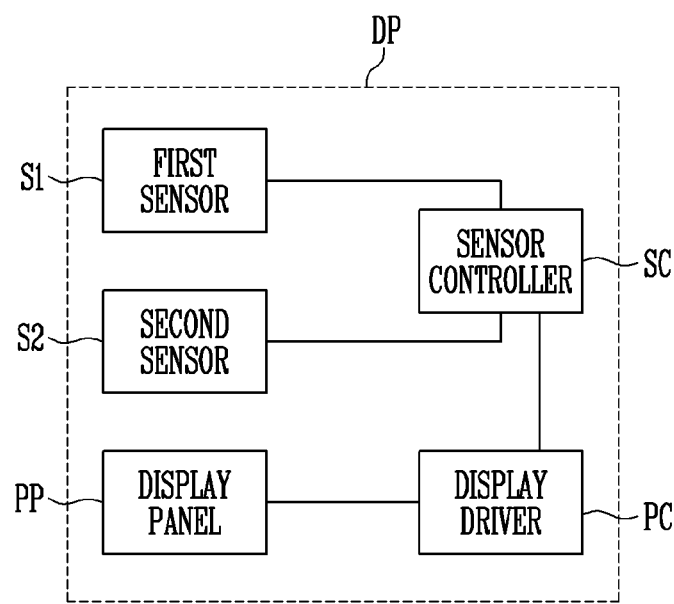
FIG. 1 is a block diagram illustrating a display device according to an embodiment of the present disclosure.

FIG. 1 is a block diagram illustrating a display device according to an embodiment of the present disclosure.

The display device according to the embodiment of the present disclosure as an element for displaying an image may be applied to one of various electronic devices. For example, the display device may be an element applied to one of a television set, a laptop computer, a mobile phone, a smart phone, a smart pad, a portable multimedia player (PMP), a personal digital assistant (PDA), a navigator, and various wearable devices such as a smart watch.

Referring to FIG. 1, the display device DP according to the embodiment of the present disclosure includes a display panel PP for displaying an image, a display driver PC for driving the display panel PP, a first sensor S1 and a second sensor S2 for sensing a position of a touch of a user, and a sensor controller SC for controlling the first sensor S1 and the second sensor S2. The first sensor S1, the second sensor S2, and the sensor controller SC may function as input devices for providing touch information of the user. The sensor controller SC and the display driver PC are connected to each other and the image may be implemented by the display panel PP through the display driver PC in accordance with the touch information from the first sensor S1 and the second sensor S2.

According to an embodiment of the present disclosure, one of the first sensor S1 and the second sensor S2 is a sensor for sensing the touch position and the other of the first sensor S1 and the second sensor S2 may be a sensor for sensing the touch pressure. The first sensor S1 and the second sensor S2 may be one of various types of sensors, for example, capacitance type sensors or resistance film type sensors.

According to the embodiment of the present disclosure, the sensor controller SC controls operations of the first sensor S1 and the second sensor S2. According to an embodiment of the present disclosure, the sensor controller SC may sense the touch position by sensing capacitance or resistance of the first sensor S1 and may sense the touch pressure caused by the touch of the user by sensing capacitance of the second sensor S2. According to the embodiment, the sensor controller SC may simultaneously or sequentially drive the operations of the first sensor S1 and the second sensor S2.

The display driver PC includes a driving circuit for displaying the image and may include no less than one microprocessor, integrated circuit, and storage device. Although not shown, the display device may further include input and output devices such as a keyboard and a microphone.

Figure 2:
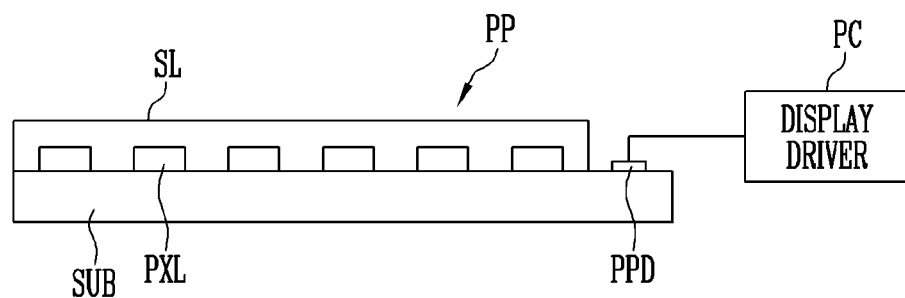
FIG. 2 is a conceptual view illustrating a display panel and a display driver in a display device according to an embodiment of the present disclosure.
Figure 3A:
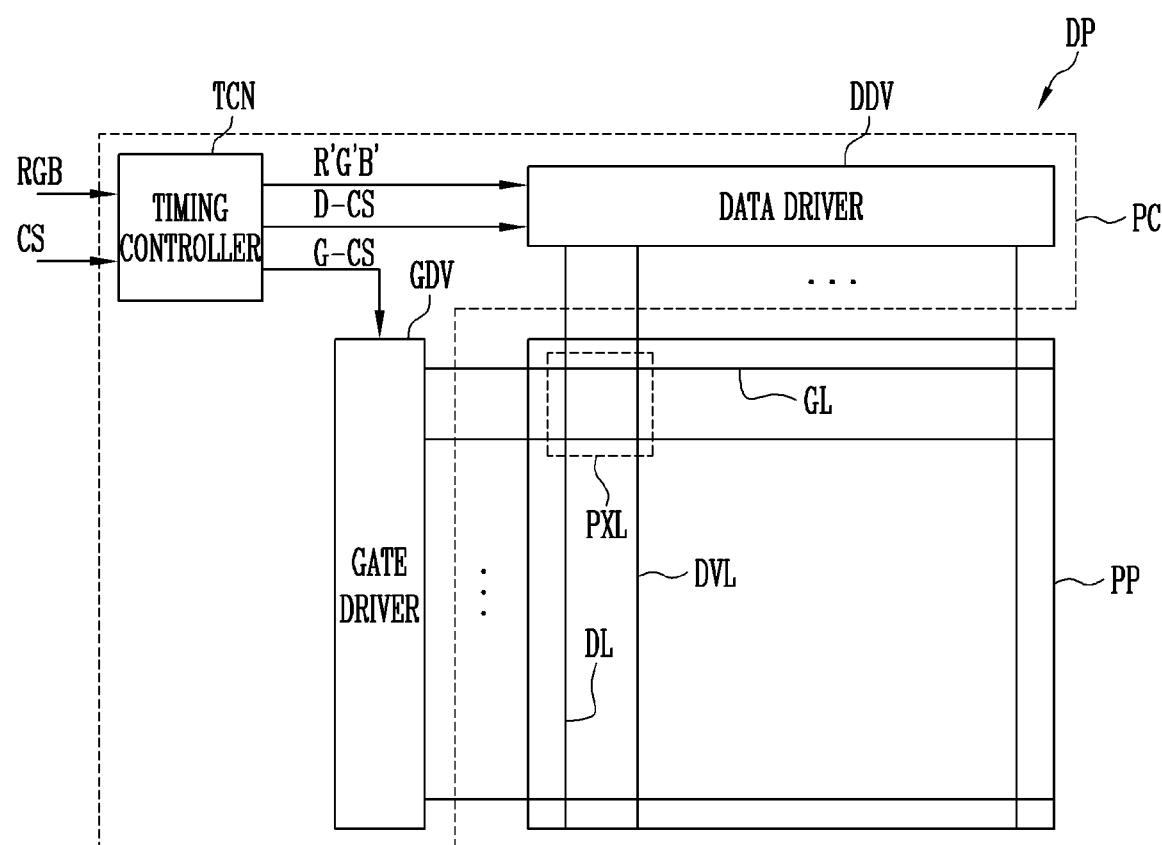
FIG. 3A is a block diagram illustrating a display panel according to an embodiment of the present disclosure.
Figure 3B:
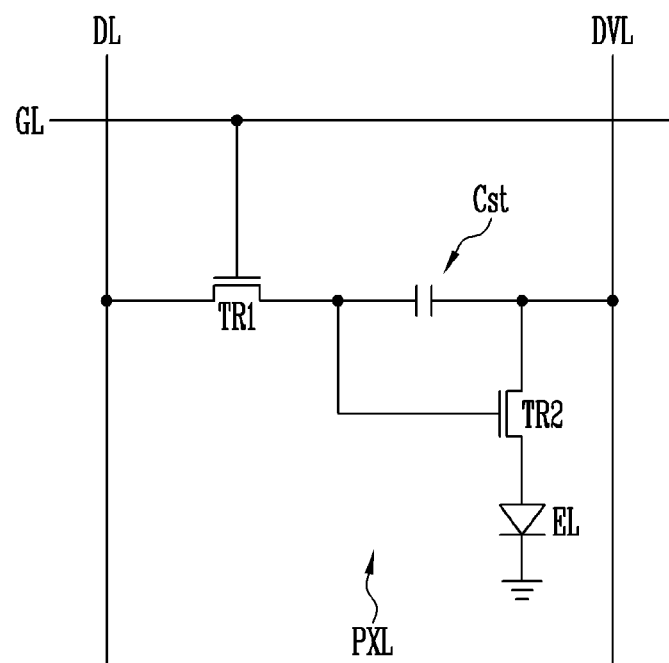
FIG. 3B is a circuit diagram illustrating the pixel of FIG. 3A.
Figure 3C:
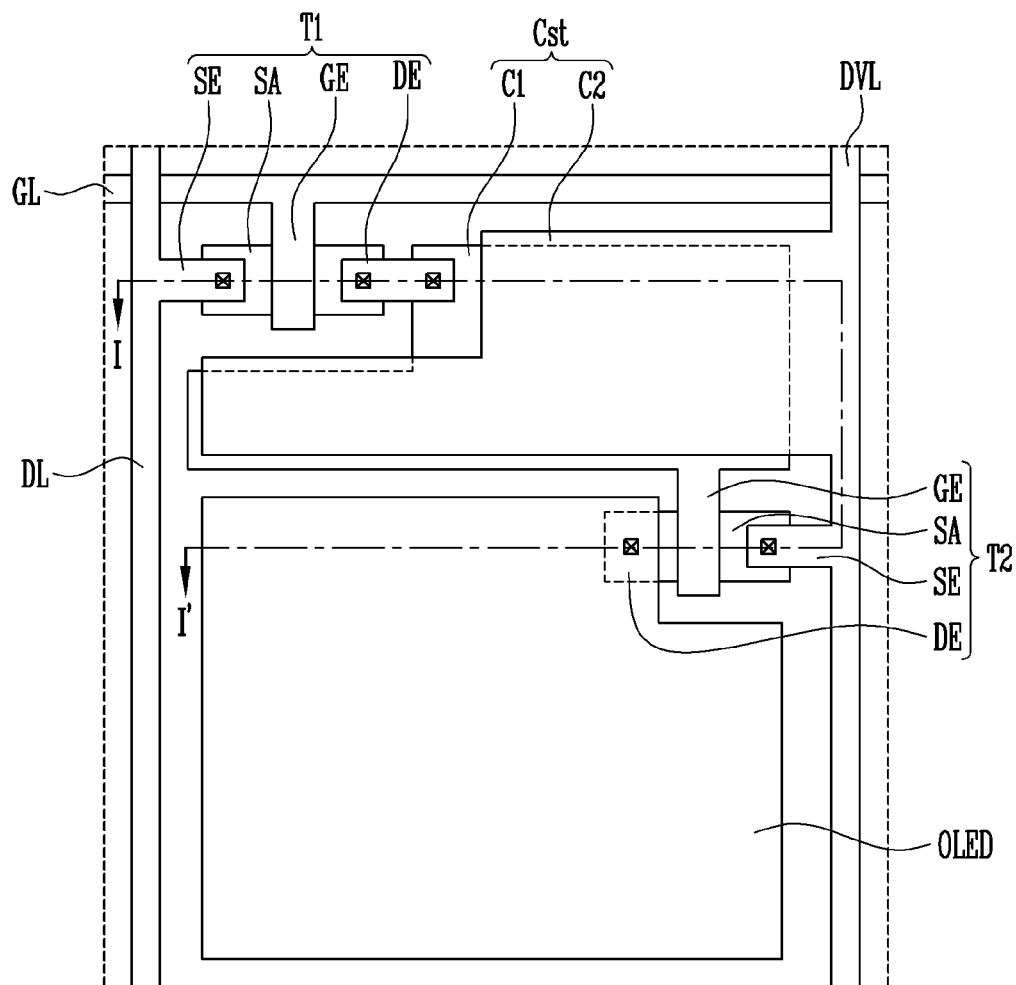
FIG. 3C is a plan view illustrating the pixel of FIG. 3B.
Figure 3D:
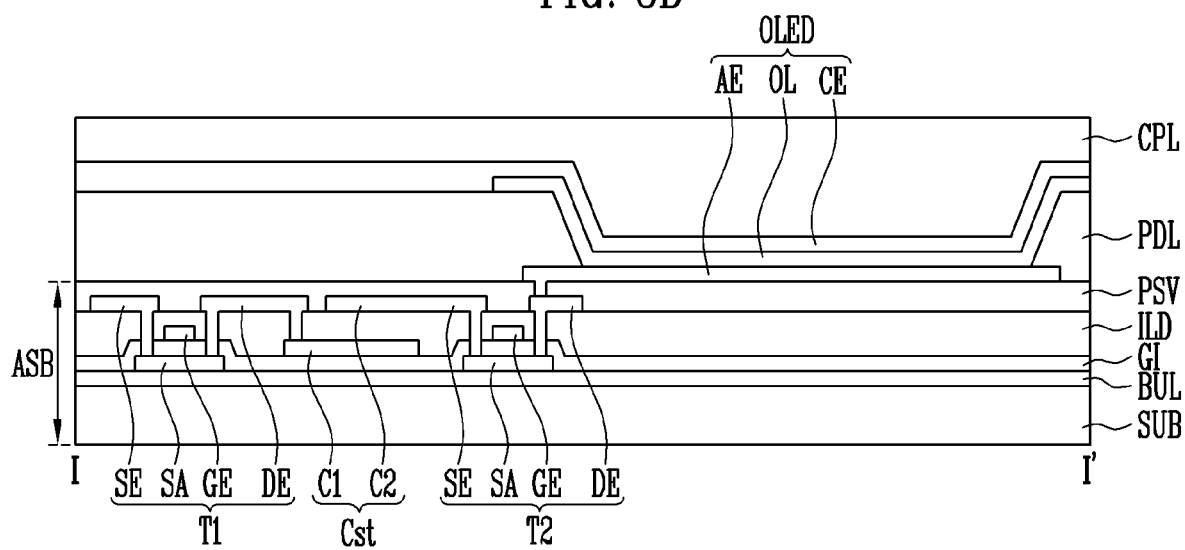
FIG. 3D is a cross-sectional view taken along the line I-I' of FIG. 3C.

FIG. 2 is a conceptual view illustrating a display panel and a display driver in a display device according to an embodiment of the present disclosure. FIG. 3A is a block diagram illustrating a display panel according to an embodiment of the present disclosure. FIG. 3B is a circuit diagram illustrating the pixel of FIG. 3A. FIG. 3C is a plan view illustrating the pixel of FIG. 3B. FIG. 3D is a cross-sectional view taken along the line I-I' of FIG. 3C.

Referring to FIG. 2, the display panel PP includes a substrate SUB, pixels PXL provided on the substrate SUB, an encapsulation substrate CPL for covering the pixels PXL, and a pad PPD connected to the pixels PXL through signal lines.

The display driver PC is connected to the pixels PXL through the pad PPD of the display panel PP.

Referring to FIGS. 3A and 3B, the display panel PP includes the plurality of pixels PXL. The display driver PC may include a gate driver GDV and a data driver DDV for driving the pixels PXL and a timing controller TCN for controlling driving of the gate driver GDV and the data driver DDV.

According to an embodiment of the present disclosure, it is illustrated that elements of the display driver PC are separate from the display panel PP. However, the present disclosure is not limited thereto. Some elements of the display driver PC may be provided on the display panel PP. For example, according to another embodiment of the present disclosure, the gate driver GDV and/or the data driver DDV may be embedded on the display panel PP.

Each of the pixels PXL for displaying an image may be an organic light emitting element, a liquid crystal element, an electrowetting element, or an electrophoretic element. However, the present disclosure is not limited thereto. According to an embodiment of the present disclosure, the pixel PXL may be the organic light emitting element. Hereinafter, it is illustrated that the pixel PXL is the organic light emitting element.

Each of the pixels PXL includes a wiring line formed of a gate line GL, a data line DL, and a driving voltage line DVL, a thin film transistor (TFT) connected to the wiring line, an organic light emitting element EL connected to the TFT, and a capacitor Cst.

The gate line GL extends in one direction. The data line DL extends in another direction that intersects the gate line GL. The driving voltage line DVL may extend in the same direction as the data line DL. The gate line GL transmits a gate signal to the TFT. The data line DL transmits a data signal to the TFT. The driving voltage line DVL transmits a driving voltage to the TFT.

The TFT may include a driving TFT TR2 for controlling the organic light emitting element EL and a switching TFT TR1 for switching the driving TFT TR2. According to an embodiment of the present disclosure, it is illustrated that one pixel PXL includes two TFTs TR1 and TR2. However, the present disclosure is not limited thereto. One pixel PXL may include one TFT and one capacitor or no less than three TFTs and no less than two capacitors.

In the switching TFT TR1, a gate electrode is connected to the gate line GL and a source electrode is connected to the data line DL. A drain electrode of the switching TFT is connected to a gate electrode of the driving TFT TR2. The switching TFT TR1 transmits the data signal applied to the data line DL to the driving TFT TR2 in accordance with the gate signal applied to the gate line GL.

In the driving TFT TR2, the gate electrode is connected to the drain electrode of the switching TFT, a source electrode is connected to the driving voltage line DVL, and a drain electrode is connected to the organic light emitting element EL.

The organic light emitting element EL includes a light emitting layer (not shown) and a first electrode (not shown) and a second electrode (not shown) that face each other with the light emitting layer interposed therebetween. The first electrode is connected to the drain electrode of the driving TFT TR2. A common voltage is applied to the second electrode and the light emitting layer EML displays the image by emitting light or not emitting light in accordance with an output signal of the driving TFT TR2. Here, the light emitted from the light emitting layer EML may be white light or color light.

The capacitor Cst may be connected between the gate electrode and the source electrode of the driving TFT TR2 and charges and maintains the data signal input to the gate electrode of the driving TFT TR2.

The timing controller TCN receives a plurality of image signals RGB and a plurality of control signals CS from the outside of the display device DP. The timing controller TCN converts data formats of the image signals RGB so as to be suitable for an interface specification of the data driver DDV and provides converted image signals R'G'B' to the data driver DDV. In addition, the timing controller TCN generates data control signals D-CS (for example, an output start signal, a horizontal start signal, etc.) and gate control signals G-CS (for example, a vertical start signal, a vertical clock signal, and a vertical clock bar signal) based on the plurality of control signals CS. The data control signals D-CS are provided to the data driver DDV and the gate control signals G-CS are provided to the gate driver GDV.

The gate driver GDV sequentially outputs gate signals in response to the gate control signals G-CS provided by the timing controller TCN. Therefore, the plurality of pixels PXL may be sequentially scanned by the gate signals in units of rows.

The data driver DDV converts the image signals R'G'B' into data signals in response to the data control signals D-CS provided by the timing controller TCN and outputs the data signals. The output data signals are applied to the pixels PXL.

Therefore, each of the pixels PXL is turned on by the gate signal and the turned on pixel PXL receives a corresponding data voltage from the data driver DDV and displays an image of desired gray scale.

The pixel PXL of the above-described display panel PP may be implemented by the organic light emitting element EL. Referring to FIGS. 3C and 3D, the display panel PP may include an array substrate ASB, an organic light emitting diode OLED disposed on the array substrate ASB, and the encapsulation substrate CPL for covering the organic light emitting diode OLED.

The array substrate ASB may include a substrate SUB, a first TFT T1, a second TFT T2, and a capacitor Cst arranged on the substrate SUB.

The substrate SUB is formed of an insulating material. The substrate SUB may be a rigid substrate. For example, the substrate SUB may be one of a glass base substrate, a quartz base substrate, a glass ceramic base substrate, and a crystalline glass base substrate.

The substrate SUB may be a flexible substrate. Here, the substrate SUB may be one of a film base substrate and a plastic substrate each including a polymeric organic material. For example, the substrate SUB may include one among polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the substrate SUB may include fiber glass reinforced plastic (FRP).

The material used for the substrate SUB may have resistance (or heat resistance) against a high processing temperature in manufacturing processes of the display device.

One of the first TFT T1 and the second TFT T2, for example, the first TFT T1 may be a switching element. Therefore, the first TFT T1 may be connected to the gate line GL and the data line DL.

The other of the first TFT T1 and the second TFT T2, for example, the second TFT T2 may be a driving element. Therefore, the second TFT T2 may be connected to the capacitor Cst, the organic light emitting diode OLED and a driving voltage line DVL.

Each of the first TFT T1 and the second TFT T2 may include a semiconductor layer SA, a gate electrode GE insulated from the semiconductor layer SA, and a source electrode SE and a drain electrode DE connected to the semiconductor layer SA.

The semiconductor layer SA may be disposed on the substrate SUB. The semiconductor layer SA may include one among amorphous silicon (a-Si), polycrystalline silicon (p-Si), an oxide semiconductor, and an organic semiconductor. Here, the oxide semiconductor may include at least one among zinc (Zn), indium (In), gallium (Ga), tin (Sn), and a mixture of the above metals. For example, the oxide semiconductor may include indium-gallium-zinc oxide (IGZO).

In addition, in the semiconductor layer SA, areas connected to the source electrode SE and the drain electrode DE may be a source area and a drain area that are doped with impurities or into which impurities are implanted. In addition, an area between the source area and the drain area may be a channel area.

On the other hand, although not shown in the drawing, when the semiconductor layer SA includes the oxide semiconductor, a light blocking layer for blocking light incident on the semiconductor layer SA may be arranged on or under the semiconductor layer SA.

A buffer layer BUL may be disposed between the substrate SUB and the semiconductor layer SA. The buffer layer BUL may include at least one of a silicon oxide SiOx and a silicon nitride SiNx. For example, the buffer layer BUL may include a first layer including the silicon oxide SiOx and a second layer disposed on the first layer and including the silicon nitride SiNx. In addition the buffer layer BUL may include a silicon oxynitride SiON. The buffer layer BUL prevents impurities from being diffused from the substrate SUB into the semiconductor layer SA of each of the first TFT T1 and the second TFT T2 and may prevent electric characteristics of the first TFT T1 and the second TFT T2 from deteriorating.

In addition, the buffer layer BUL may prevent moisture and oxygen from permeating into the organic light emitting diode OLED from the outside. The buffer layer BUL may planarize a surface of the substrate SUB.

A gate insulating layer GI for covering the semiconductor layer SA may be disposed on the substrate SUB and the semiconductor layer SA. The gate insulating layer GI may insulate the semiconductor layer SA and the gate electrode GE. The gate insulating layer GI may include at least one of the silicon oxide SiOx and the silicon nitride SiNx.

The gate line GL that extends in one direction, the gate electrode GE, and a first capacitor electrode C1 of the capacitor Cst may be disposed on the gate insulating layer GI.

An interlayer insulating layer ILD may be disposed on the gate insulating layer GI, the gate line GL, the gate electrode GE, and the first capacitor electrode C1. That is, the interlayer insulating layer ILD may cover the gate electrode GE. The interlayer insulating layer ILD may include at least one of the silicon oxide SiOx and the silicon nitride SiNx like the gate insulating layer GI. In addition, a portion of the interlayer insulating layer ILD is removed so that the source area and the drain area of the semiconductor layer SA may be exposed.

The data line DL insulated from the gate line GL and intersecting the gate line GL, the driving voltage line DVL arranged to be separate from the data line DL, a second capacitor electrode C2 of the capacitor Cst, and the source electrode SE and the drain electrode DE may be disposed on the interlayer insulating layer ILD.

The source electrode SE and the drain electrode DE may be insulated from the gate electrode GE by the interlayer insulating layer ILD. In addition, the source electrode SE and the drain electrode DE may be connected to the source area and the drain area.

On the other hand, according to the current embodiment, it is illustrated that both the second TFT T2 and the first TFT T1 have top gate structures. However, the present disclosure is not limited thereto. For example, at least one of the second TFT T2 and the first TFT T1 may have a bottom gate structure.

The capacitor Cst may include the first capacitor electrode C1 and the second capacitor electrode C2. The first capacitor electrode C1 may include the same material as the gate line GL and the gate electrode GE and may be arranged in the same plane as the gate line GL and the gate electrode GE.

The second capacitor electrode C2 may include the same material as the data line DL, the power source supplying line VL, the source electrode SE, and the drain electrode DE and may be arranged in the same plane as the data line DL, the driving voltage line DVL, the source electrode SE, and the drain electrode DE.

A protective layer PSV may be disposed on the substrate SUB on which the first TFT T1, the second TFT T2, and the capacitor Cst are arranged. That is, the protective layer PSV may cover the first TFT T1, the second TFT T2, and the capacitor Cst. In addition, the protective layer PSV may expose a portion of the drain electrode DE of the second TFT T2.

The protective layer PSV may include at least one layer. For example, the protective layer PSV may include at least one of an inorganic protective layer and an organic protective layer. For example, the protective layer PSV may include the inorganic protective layer that covers the first TFT T1, the second TFT T2, and the capacitor Cst and the organic protective layer arranged on the inorganic protective layer.

The inorganic protective layer may include at least one of the silicon oxide SiOx and the silicon nitride SiNx. In addition, the organic protective layer may include an organic insulating material that may transmit light. For example, the organic protective layer may include at least one among polyacrylates resin, epoxy resin, phenolic resin, polyamides resin, polyimides resin, unsaturated polyesters resin, polyphenylene ethers resin, polyphenylene sulfides resin, and benzocyclobutene resin.

The organic light emitting diode OLED connected to the drain electrode DE of the second TFT T2 may be disposed on the protective layer PSV.

The organic light emitting diode OLED may include a first electrode AE connected to the drain electrode DE of the second TFT T2, an organic layer OL disposed on the first electrode AE, and a second electrode CE disposed on the organic layer OL.

One of the first electrode AE and the second electrode CE may be an anode electrode and the other of the first electrode AE and the second electrode CE may be a cathode electrode.

For example, the first electrode AE may be the anode electrode and the second electrode CE may be the cathode electrode.

In addition, at least one of the first electrode AE and the second electrode CE may be a transmissive electrode. For example, when the organic light emitting diode OLED is a rear surface emission type OLED, the first electrode AE is the transmissive electrode and the second electrode CE may be a reflective electrode. When the organic light emitting diode OLED is a front surface emission type OLED, the first electrode AE is a reflective electrode and the second electrode CE may be a transmissive electrode. When the organic light emitting diode OLED is a double side emission type OLED, both the first electrode AE and the second electrode CE may be transmissive electrodes. According to the embodiment of the present disclosure, it is illustrated that the first electrode AE is the anode electrode and the organic light emitting diode OLED is the front surface emission type OLED.

The first electrode AE may be disposed on the protective layer PSV. The first electrode AE may include a reflecting layer (not shown) capable of reflecting light and a transparent conductive layer (not shown) arranged on or under the reflecting layer. At least one of the reflecting layer and the transparent conductive layer may be connected to the drain electrode DE of the second TFT T2.

The reflecting layer may include a material capable of reflecting light. For example, the reflecting layer may include at least one among Al, Ag, Cr, Mo, platinum (Pt), Ni, and an alloy of the above metals.

The transparent conductive layer may include a transparent conductive oxide. For example, the transparent conductive layer may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be disposed on the first electrode AE and the protective layer PSV. The pixel defining layer PDL may expose a portion of the first electrode AE. For example, the pixel defining layer PDL may cover an edge of the first electrode AE and the protective layer PSV.

The pixel defining layer PDL may include an organic insulating material. For example, the pixel defining layer PDL may include at least one among polystyrene, polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), siloxane based resin, and silane based resin.

The organic layer OL may have a multilayer thin film structure including at least one light emitting layer EML. For example, the organic layer OL may further include at least one among a hole injection layer HIL for injecting holes, a hole transport layer HTL, with high transportability of holes, for preventing electrons that are not combined in the light emitting layer EML from moving and increasing recombination probability of holes and electrons, the light emitting layer EML for emitting light by recombination of the injected electrons and holes, an electron transport layer ETL for smoothly transporting electrons to the light emitting layer EML, and an electron injection layer EIL for injecting electrons.

The organic layer OL may further include an electron blocking layer EBL and a hole blocking layer HBL. At this time, the hole blocking layer HBL may be provided between the light emitting layer EML and the electron transport layer ETL and the electron blocking layer EBL may be provided between the light emitting layer EML and the hole transport layer HTL. Therefore, as occasion demands, in the organic layer OL, the hole injection layer HIL, the hole transport layer HTL, the electron blocking layer EBL, the light emitting layer EML, the hole blocking layer HBL, the electron transport layer ETL, and the electron injection layer EIL may be sequentially stacked.

However, the hole injection layer HIL, the hole transport layer HTL, the hole blocking layer HBL, the electron transport layer ETL, the electron injection layer EIL, and the electron blocking layer EBL do not only have functions in accordance with their names. For example, the hole transport layer HTL performs a function of the electron blocking layer EBL of preventing the electrons generated by the light emitting layer from being diffused in accordance with a kind of a selected compound excluding a function of transporting the holes. The electron transport layer ETL may perform a function of the hole blocking layer HBL of preventing the holes generated by the light emitting layer from being diffused in accordance with a kind of a selected compound excluding a function of transporting the electrons On the other hand, a color of light generated by the light emitting layer EML may be one of red, green, blue, and white. However, the present disclosure is not limited thereto. For example, the color of the light generated by the light emitting layer EML of the organic layer OL may be one of magenta, cyan, and yellow.

The second electrode CE may be disposed on the organic layer OL. The second electrode CE may be a semi-transmissive reflecting layer. For example, the second electrode CE may be a thin metal layer having a thickness at which the light may be transmitted. The second electrode CE transmits a portion of the light generated by the organic layer OL and may reflect the remaining light generated by the organic layer OL. The light reflected from the second electrode CE is reflected from the reflecting layer of the first electrode AE and may pass through the second electrode CE by constructive interference.

The second electrode CE may include a material having a lower work function than the transparent conductive layer of the first electrode AE. For example, the second electrode CE may include at least one among Mo, tungsten (W), Ag, magnesium (Mg), Al, Pt, palladium (Pd), gold (Au), Ni, Nd, iridium (Ir), Cr, lithium (Li), calcium (Ca), and an alloy of the above metals.

The encapsulation substrate CPL is provided on the pixel PXL and covers and protects the pixel PXL. The encapsulation substrate CPL may be provided on the pixel PXL in the form of not only a substrate but also a thin film. According to an embodiment of the present disclosure, the encapsulation substrate CPL may be implemented by a stacked layer not an additional substrate. The encapsulation substrate CPL may isolate the organic light emitting diode OLED from an external environment. Therefore, the encapsulation substrate CPL is arranged on the second electrode CE and may prevent moisture and oxygen from permeating into the organic light emitting diode OLED. The encapsulation substrate CPL is provided on the pixel PXL in the form of an insulating substrate formed of glass and polymeric resin or may be provided on the pixel PXL in the form of a thin film obtained by stacking an organic layer and/or an inorganic layer.

Then, the first sensor S1 and the second sensor S2 will be described. Hereinafter, it is illustrated that the first sensor S1 senses the touch position and the second sensor S2 senses the touch pressure.

Figure 4A:
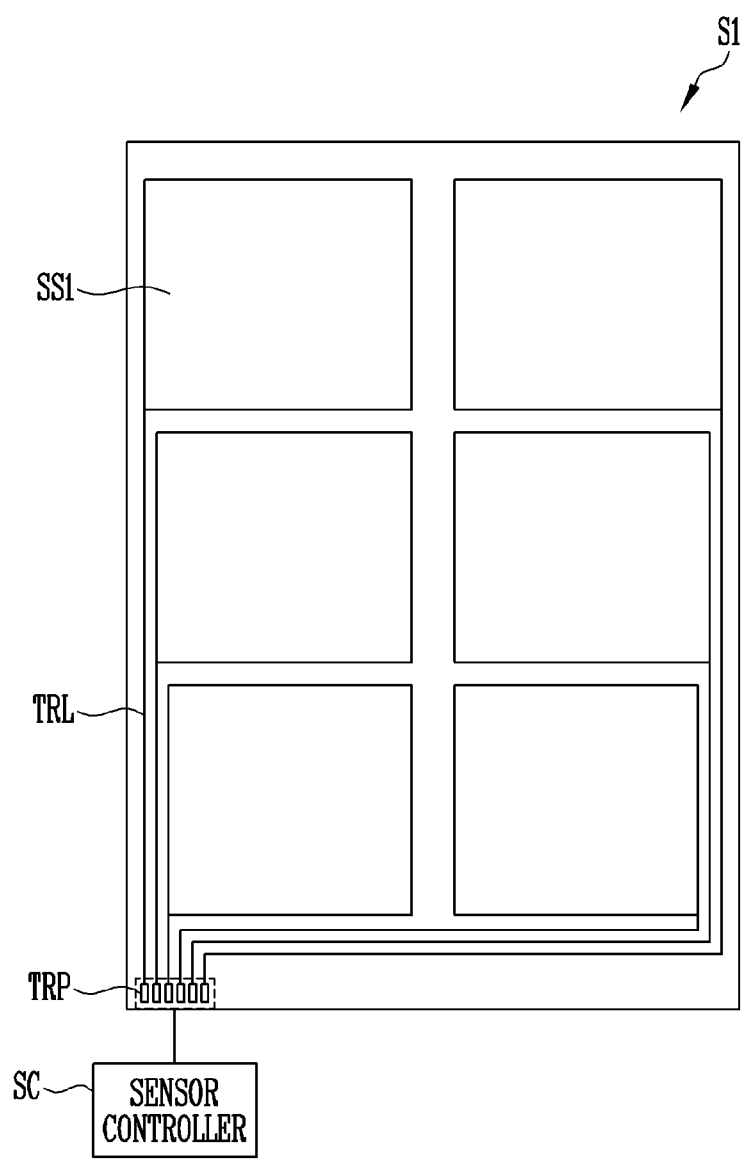
FIGS. 4A and 4B are plan views illustrating a first sensor according to an embodiment of the present disclosure.
Figure 4B:
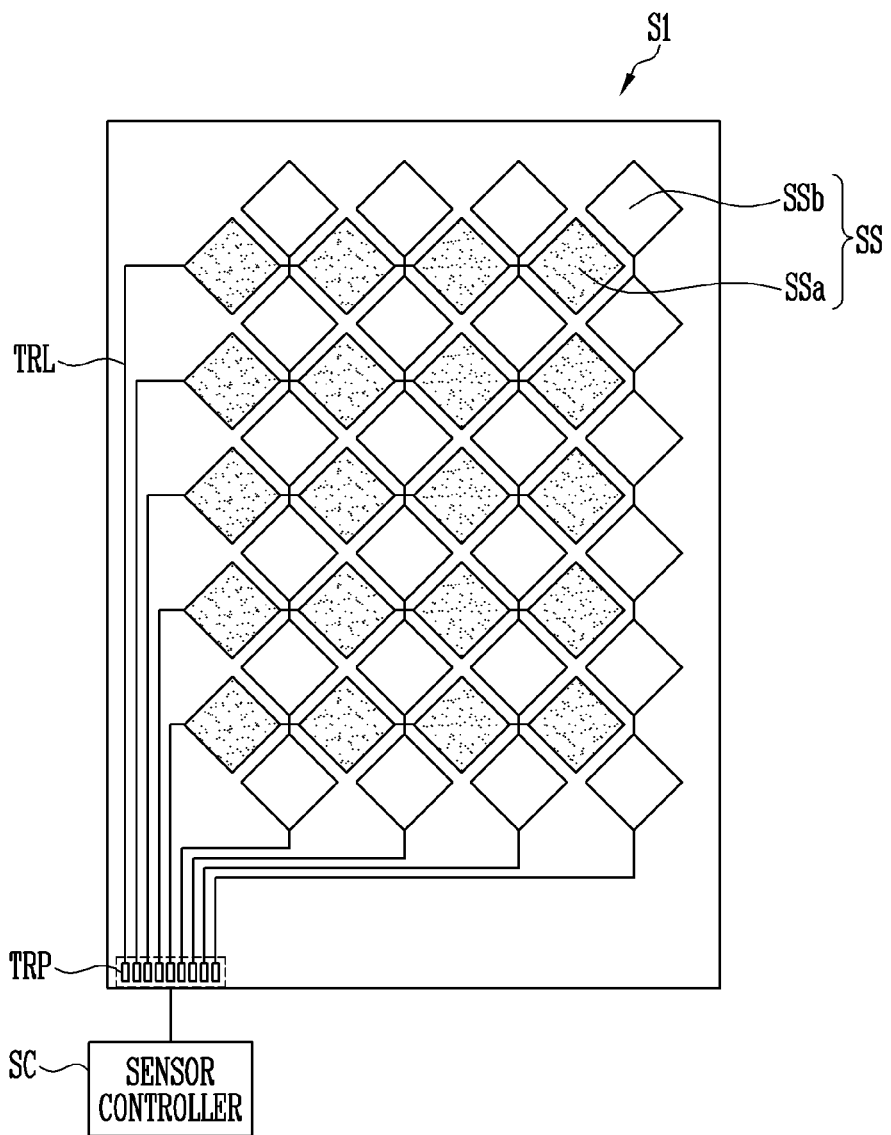

FIGS. 4A and 4B are plan views illustrating the first sensor S1 according to an embodiment of the present disclosure. FIG. 4A illustrates a self-capacitance type first sensor S1 and FIG. 4B illustrates a mutual capacitance type first sensor S1.

Referring to FIGS. 1, 2, and 4A, the first sensor S1 according to an embodiment of the present disclosure may be the self-capacitance type sensor. The first sensor S1 senses the touch position.

The first sensor S1 according to an embodiment of the present disclosure may include a plurality of sensing electrodes SS1 and wiring lines TRL. Pads TRP may be provided at ends of the wiring lines TRL. The pads TRP are connected to a sensor controller SC.

According to an embodiment of the present disclosure, it is illustrated that the sensing electrodes SS1 are square. However, the present disclosure is not limited thereto. The sensing electrodes SS1 may have one of various shapes. For example, each of the sensing electrodes SS1 may be circular or may extend in one direction so that the sensing electrodes SS1 may be entirely stripe shaped. The sensing electrodes SS1 may extend in a direction of a long side of a substrate, in a direction of a short side of the substrate, or in a direction inclined to the substrate.

The sensing electrodes SS1 may include a conductive material, for example, metals, an alloy of the metals, conductive polymer, or a conductive metal oxide. According to an embodiment of the present disclosure, the metals may include copper (Cu), Ag, Au, Pt, Pd, Ni, Sn, aluminum (Al), cobalt (Co), rhodium (Rh), Ir, iron (Fe), ruthenium (Ru), osmium (Os), manganese (Mn), Mo, W, niobium (Nb), tantalum (Ta), titanium (T1), bismuth (Bi), antimony (Sb), and lead (Pb). The conductive metal oxide may be indium tin oxide (ITO), indium zinc oxide (IZO), antimony zinc oxide (AZO), indium tin zinc oxide (ITZO), zinc oxide (ZnO), or tin oxide ($SnO_2$). According to an embodiment of the present disclosure, the sensing electrodes SS1 may be formed of a single layer or a multilayer. The conductive polymer may be one of a polythiophene-based compound, a polypyrole-based compound, a polyanyline-based compound, a polyacetylene-based compound, a polyphenylene-based compound, and a mixture of the above compounds. In particular, a PEDOT/PSS compound may be used as the polythiophene-based compound. Since the conductive polymer may be easily manufactured and is more flexible than the conductive metal oxide, for example, ITO, probability of generating crack during the bending of the conductive polymer may be reduced.

The sensing electrodes SS1 and the wiring lines TRL are implemented on an additional insulating substrate or may be implemented on various elements included in a display device DP. For example, the sensing electrodes SS1 and the wiring lines TRL may be directly formed on the display panel PP used for the display device DP. For example, the sensing electrodes SS1 and the wiring lines TRL may be directly formed on the encapsulation substrate CPL of the display panel PP or on a rear surface of a window WD to be described later.

When the sensing electrodes SS1 and the wiring lines TRL are implemented by the additional insulating substrate, the insulating substrate may be formed of an insulating material such as glass or resin. In addition, the insulating substrate may be formed of a flexible material so as to be curved or folded and may have a single layer structure or a multilayer structure. For example, the insulating substrate may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The material that forms the insulating substrate may vary and may include fiber glass reinforced plastic FRP.

The wiring lines TRL may be connected between the sensing electrodes SS1 and the pads TRP. In addition, the wiring lines TRL may be connected to the sensor controller SC through the pads TRP. For example, the pads TRP may be connected to the sensor controller SC through an additional wiring line, a flexible printed circuit board (FPCB), a tape carrier package, a connector, or a chip on film (COF).

When a touch is input to the first sensor S1, since self-capacitance of the sensing electrodes SS1 related to the touch changes, the sensor controller SC may detect the touch position by using a signal output from the sensing electrodes SS1.

Referring to FIGS. 1, 2, and 4B, the first sensor S1 according to an embodiment of the present disclosure may be the mutual capacitance type sensor.

In addition, the first sensor S1 may include first sensing electrodes SSa, second sensing electrodes SSb, the wiring lines TRL, and the pads TRP each provided at one end of each of the wiring lines TRL. The first sensing electrodes SSa and the second sensing electrodes SSb may be connected to the sensor controller SC through the pads TRP.

The plurality of first sensing electrodes SSa are longitudinally formed in one direction and may be arranged in another direction that intersects the one direction. The second sensing electrodes SSb are insulated from the first sensing electrodes SSa and may function as mutual capacitance type sensors together with the first sensing electrodes SSa. For this purpose, the second sensing electrodes SSb may be arranged to intersect the first sensing electrodes SSa. For example, the plurality of second sensing electrodes SSb are longitudinally formed in the other direction and may be arranged in the one direction.

According to an embodiment of the present disclosure, it is illustrated that the first sensing electrodes and the second sensing electrodes SSa and SSb are diamond-shaped. However, the first sensing electrodes and the second sensing electrodes SSa and SSb may have one of various shapes. For example, each of the first sensing electrode and the second sensing electrodes SSa and SSb may be circular. In addition, each of the first sensing electrodes SSa may extend in one direction so that the first sensing electrodes SSa may be entirely stripe shaped and the second sensing electrodes SSb may extend in intersecting directions to be stripe shaped.

Due to the above-described arrangement of the first sensing electrodes SSa and the second sensing electrodes SSb, mutual capacitance is formed between the first sensing electrodes SSa and the second sensing electrodes SSb. When the touch is input to the first sensor S1, the mutual capacitance related to the touch changes. In order to prevent the first sensing electrodes SSa and the second sensing electrodes SSb from contacting each other, an insulating layer (not shown) may be formed between the first sensing electrodes SSa and the second sensing electrodes SSb. The insulating layer may be entirely formed between the first sensing electrodes SSa and the second sensing electrodes SSb or may be locally formed at intersections between the first sensing electrodes SSa and the second sensing electrodes SSb.

The first sensing electrodes SSa and the second sensing electrodes SSb may be formed of a transparent conductive material or a conductive material such as opaque metal. For example, the first sensing electrodes SSa and the second sensing electrodes SSb may be formed of the same material as the above-described sensing electrodes. In one embodiment of the present invention, the first sensing electrodes SSa and the second sensing electrodes SSb may have a mesh structure for improving visibility.

In FIG. 4B, it is illustrated that the first sensing electrodes SSa and the second sensing electrodes SSb are square. However, the first sensing electrodes SSa and the second sensing electrodes SSb may have one of various shapes. In addition, the first sensing electrodes SSa and the second sensing electrodes SSb may have a mesh structure for flexibility.

The wiring lines TRL may be connected between the sensing electrodes and the pads TRP. In addition, the wiring lines TRL may be connected to the sensor controller SC through the pads TRP. For example, the pads TRP may be connected to the sensor controller SC through the additional wiring line, the FPCB, the tape carrier package, the connector, or the COF.

The first sensing electrodes SSa receive a driving signal from the sensor controller SC and the second sensing electrodes SSb may output a sensing signal to which a change in capacitance is reflected to the sensor controller SC. Therefore, the sensor controller SC may detect the touch position by using the sensing signal output from the second sensing electrodes SSb.

The display device DP according to an embodiment of the present disclosure may further include the second sensor S2 for sensing the touch pressure of the user other than the above-described elements.

Figure 5:
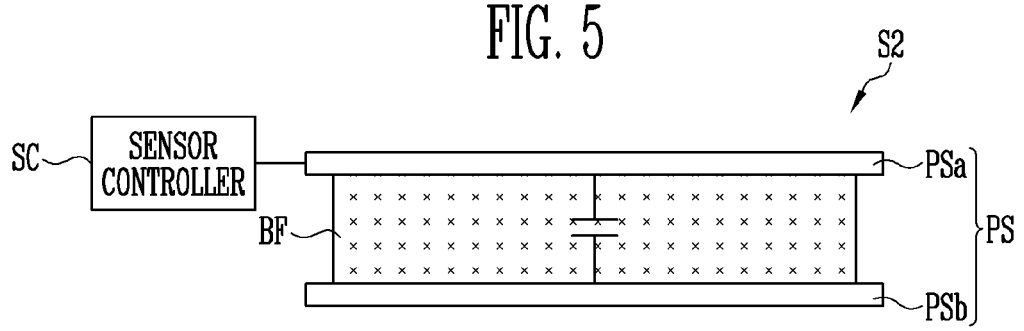
FIG. 5 is a cross-sectional view illustrating a second sensor.

FIG. 5 is a cross-sectional view illustrating the second sensor S2.

Referring to FIGS. 1, 2, and 5, the second sensor S2 is for sensing the pressure of the touch of the user. The second sensor S2 may be one of various types of sensor, for example, the capacitance type sensor for sensing the capacitance with the first sensor S1.

The second sensor S2 according to an embodiment of the present disclosure may include a first sensing electrode PSa and a second sensing electrode PSb. The first sensing electrode PSa and the second sensing electrode PSb are separate from each other so that the first sensing electrode PSa and the second sensing electrode PSb form capacitance. A dielectric substance may be disposed between the first sensing electrode PSa and the second sensing electrode PSb. According to an embodiment of the present disclosure, the dielectric substance may be an air layer without an additional element.

One of the first sensing electrode PSa and the second sensing electrode PSb of the second sensor S2 is connected to the sensor controller SC. For example, the first sensing electrode PSa may be connected to the sensor controller SC. At this time, the second sensing electrode PSb may be grounded. The sensor controller SC senses an electric characteristic value of the first sensing electrode PSa and calculates a magnitude of the touch pressure. The sensor controller SC may detect the magnitude of the applied touch pressure by sensing an amount of change in the capacitance cap between the first sensing electrode PSa and the second sensing electrode PSb. According to an embodiment, when the second sensing electrode PSb is grounded, since the output signal from the sensing electrode PSb is always uniform, the sensor controller SC needs not be connected to the second sensing electrode PSb. In this case, the sensor controller SC may determine the amount of change in the capacitance cap only by the output signal from the first sensing electrode PSa.

Although not shown, the first sensing electrode PSa of the second sensor S2 may be formed on the insulating substrate. Here, an element of the display panel PP, for example, the substrate SUB in the display panel PP may be used as the insulating substrate and the first sensing electrode PSa may be formed on the substrate SUB of the display panel PP by a printing method.

The first sensing electrode PSa of the second sensor S2 may include a conductive material such as conductive paste that may be directly printed on the substrate SUB in the display panel PP.

According to an embodiment of the present disclosure, the first sensing electrode PSa may be formed of at least one among metal paste, metal oxide paste, conductive carbon paste, and conductive polymeric paste.

The metal paste may be paste including at least one among Cu, Ag, Au, Pt, Pd, Ni, Sn, Al, Co, Rh, Ir, Fe, Ru, Os, Mn, Mo, W, Nb, Ta, T1, Bi, Sb, Pb, and an alloy of the above metals. According to an embodiment of the present disclosure, the metal paste may be at least one among Ag, Cu, and Ni.

The metal oxide paste may include at least one among ZnO, SnO, and InO. The conductive carbon paste may include at least one among graphite, carbon fiber, carbon nano-fiber, carbon nanotube, and graphene. The conductive polymer may include polythiophene-based polymer or polypyrole-based polymer.

The second sensing electrode PSb of the second sensor S2 is separate from the first sensing electrode PSa of the second sensor S2 and forms capacitance. A type of the second sensing electrode PSb of the second sensor S2 is not limited and the second sensing electrode PSb of the second sensor S2 may be formed of metal plate, a metal thin film, or another conductive layer. A kind of a conductive material used for the second sensing electrode PSb of the second sensor S2 is not limited and the second sensing electrode PSb of the second sensor S2 may be formed of one among Cu, Ag, Au, Pt, Pd, Ni, Sn, Al, Co, Rh, Ir, Fe, Ru, Os, Mn, Mo, W, Nb, Ta, T1, Bi, Sb, Pb, and an alloy of the above metals.

According to another embodiment of the present disclosure, the dielectric substance may be a buffer member BF with elasticity. The buffer member BF may contact the first sensing electrode PSa and the second sensing electrode PSb. The buffer member BF may buffer external impact and may have elasticity. For example, the buffer member BF may have elasticity by which the buffer member BF is transformed by external pressure and is restored to an original state when the external pressure is removed. In addition, the buffer member BF may have insulation property in order to prevent short circuit between the first sensing electrode PSa and the second sensing electrode PSb. The buffer member BF may be formed of porous polymer so as to have elasticity. For example, the buffer member BF may be formed of a foaming agent such as sponge. For example, the buffer member BF may include at least one among thermoplastic elastomer, polystyrene, polyolefin, polyurethane thermoplastic elastomers, polyamides, synthetic rubbers, polydimethylsiloxane, polybutadiene, polyisobutylene, [poly(styrene-butadienestyrene)], polyurethanes, polychloroprene, polyethylene, silicon, and combinations of the above materials. However, the present disclosure is not limited thereto. According to an embodiment of the present disclosure, one buffer member BF is provided. However, a plurality of buffer members BF may be provided. That is, the buffer members BF may be separate from each other and may have one of various shapes.

When the pressure is applied to the second sensor S2 due to the touch of the user, a thickness of the buffer member BF between the first sensing electrode PSa and the second sensing electrode PSb changes so that the capacitance between the first sensing electrode PSa and the second sensing electrode PSb may change. Therefore, a magnitude of the pressure may be detected by using an amount of change in the capacitance generated by the second sensor S2.

The pressure applied to the second sensor S2 may be mainly generated by the touch of the user. However, the present disclosure is not limited thereto. The pressure applied to the second sensor S2 may be generated by one of various causes.

FIGS. 6A through 6D are plan views illustrating the first sensing electrode PSa of the second sensor S2 according to embodiments of the present disclosure.

Referring to FIGS. 5 and 6A through 6D, the first sensing electrode PSa may have a mesh structure formed of fine lines. In FIGS. 6A through 6D, for convenience of description, the first sensing electrode PSa is illustrated as lines. However, the lines are actually implemented by wiring lines with a predetermined width.

The first sensing electrode PSa is provided in a touch area in which the touch of the user may occur and may have one of various shapes. For example, referring to FIGS. 5 and 6A, the first sensing electrode PSa may include fine lines arranged in a row direction and fine lines arranged in a column direction. The row direction fine lines and the column direction fine lines intersect each other and are connected to each other at intersections. The row direction fine lines and the column direction fine lines may be arranged so as to have different densities in accordance with a frequency of the touch of the user and a degree of ease of sensing the touch of the user. For example, as illustrated in the drawings, the row direction fine lines and the column direction fine lines have higher densities at edges than a center of the second sensor S2, for example, the density gradually increase from the center of the touch area toward the outside of the touch area.

Figure 6A:
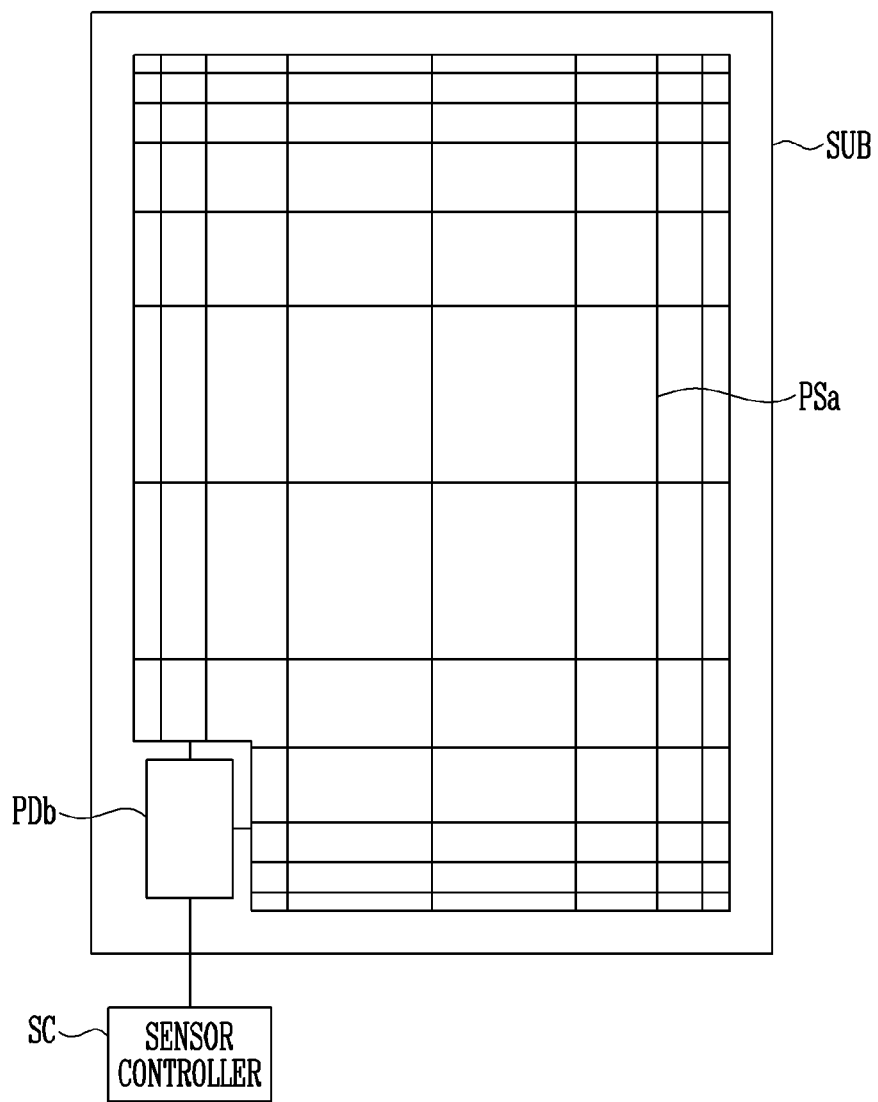
FIGS. 6A, 6B, 6C and 6D are plan views illustrating a first sensing electrode of a second sensor according to embodiments of the present disclosure.
Figure 6B:
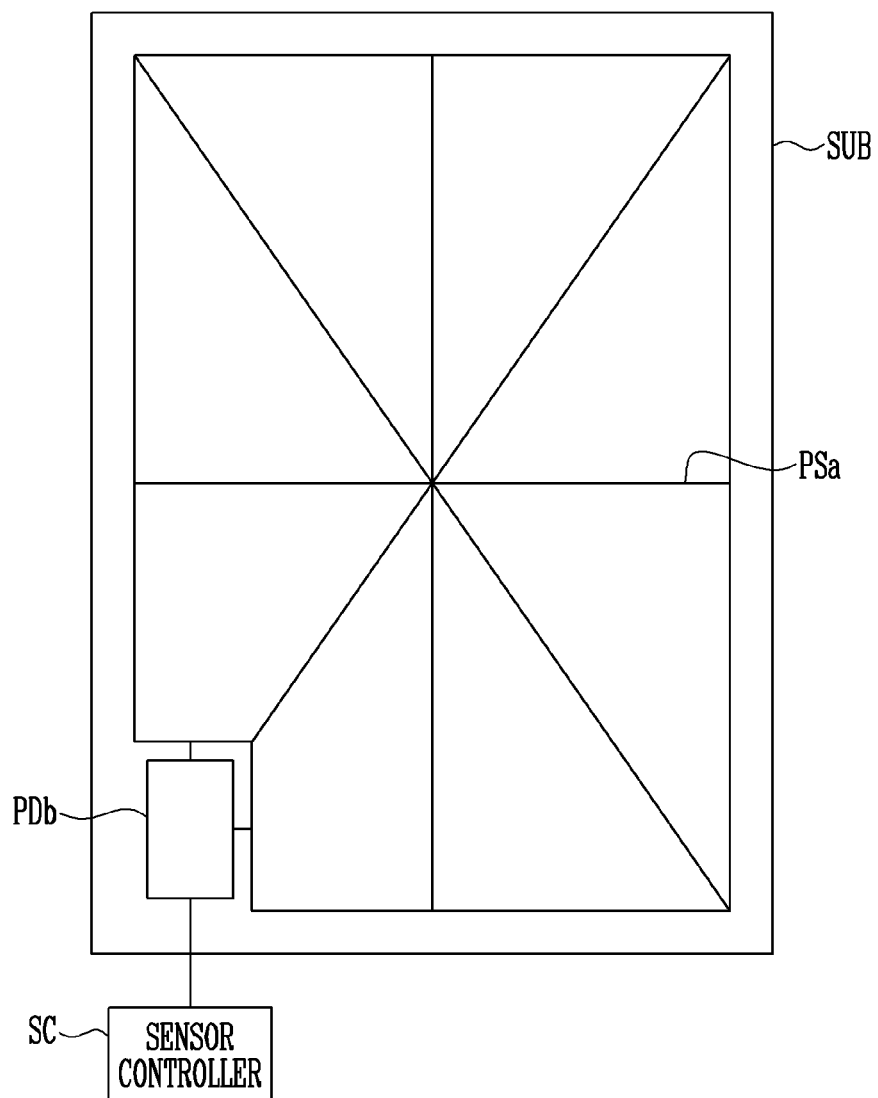

Referring to FIGS. 5 and 6B, the first sensing electrode PSa may include fine lines arranged along edges of the touch area and fine lines radially arranged from the center of the touch area toward edges of the touch area.

Figure 6C:
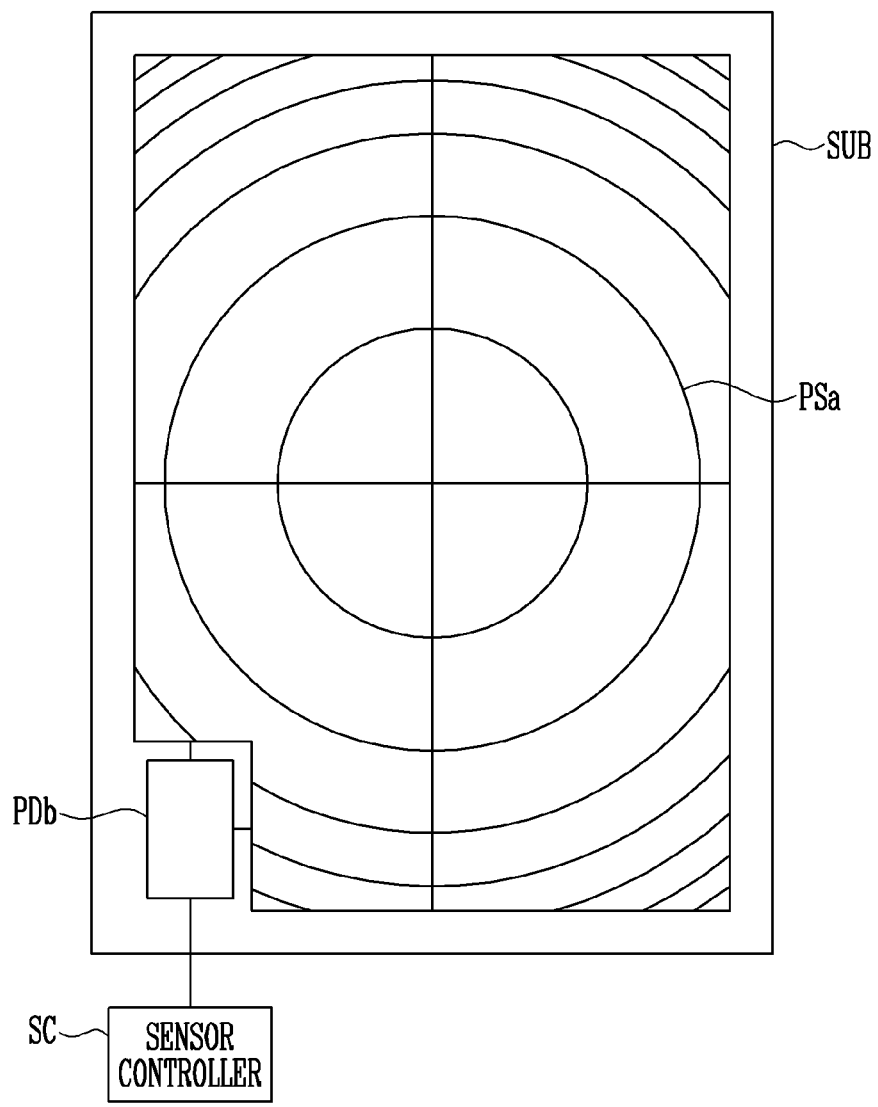

Referring to FIGS. 5 and 6C, the first sensing electrode PSa may include fine lines that form a concentric circle that has a center of the touch area as a common center. All the fine lines that form the first sensing electrode PSa are physically and electrically connected to each other and function as one electrode.

Figure 6D:
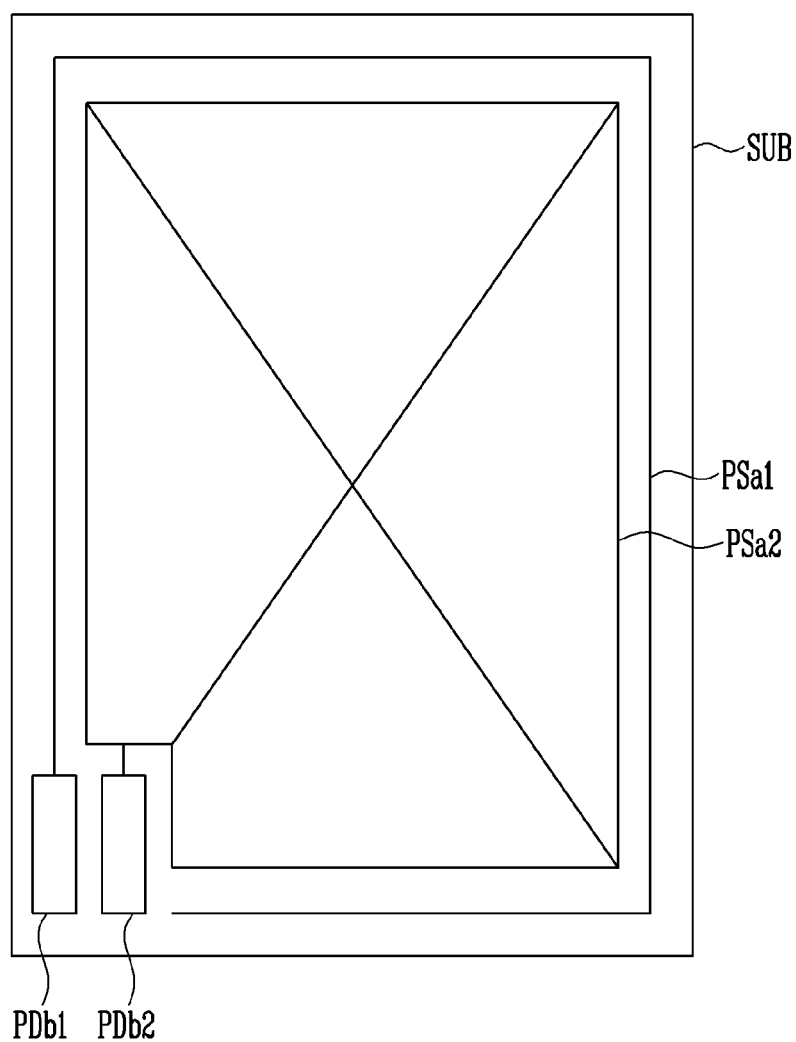

Referring to FIGS. 5 and 6D, the first sensing electrode PSa may include a plurality of sub-electrodes respectively provided in areas. For example, the first sensing electrode PSa may include two sub-electrodes, that is, a first sub-electrode PSa1 provided at edges of the touch area and a second sub-electrode PSa2 surrounded by the first sub-electrode PSa1. The first sub-electrode PSa1 and the second sub-electrode PSa2 are separate and insulated from each other and may form capacitance with the second sensing electrode PSb. The number of sub-electrodes or positions of the sub-electrodes may vary in accordance with an embodiment.

In FIGS. 5 and 6A through 6D, a pad PDb connected to the first sensing electrode PSa may be provided at one side of the first sensing electrode PSa. The pad PDb is connected to the sensor controller SC and transmits information on the change in capacitance of the first sensing electrode PSa to the sensor controller SC. The pad PDb may be connected to the sensor controller SC through an additional wiring line, a flexible printed circuit board FPCB, a tape carrier package, a connector, or a chip on film COF.

The pad PDb may be provided to each of the sub-electrodes PSa1 and PSa2 as disclosed in FIG. 6D. When the first sensing electrode PSa includes the plurality of sub-electrodes PSa1 and PSa2, pad s PDb1 and PDb2 respectively connected to the sub-electrodes PSa1 and PSa2 transmit capacitance change information from the sub-electrodes PSa1 and PSa2 to the sensor controller SC and may minutely sense pressure.

According to an embodiment of the present disclosure, it is illustrated that the first sensing electrode PSa has a mesh structure formed of fine lines. However, the present disclosure is not limited thereto. For example, the first sensing electrode PSa may have a predetermined area in order to increase sensing sensitivity. In addition, although the first sensing electrode PSa is formed of the fine lines, the first sensing electrode PSa may have one of various shapes different from the illustrated shape.

According to an embodiment of the present disclosure, the first sensing electrode PSa and the pad PDb of the second sensor S2 are not implemented by additional insulating substrates but may be implemented on an element included in the display panel PP. For example, the first sensing electrode PSa and the pad PDb of the second sensor S2 are formed on the rear surface of the substrate SUB of the display panel PP by a printing or coating method. In this case, the second sensor S2 may be integrated with the display panel PP. Therefore, since unnecessary additional substrates or layers may be removed, it is possible to reduce a thickness of the display device DP and to reduce manufacturing cost. A method of manufacturing the second sensor S2 will be described later.

Figure 7A:
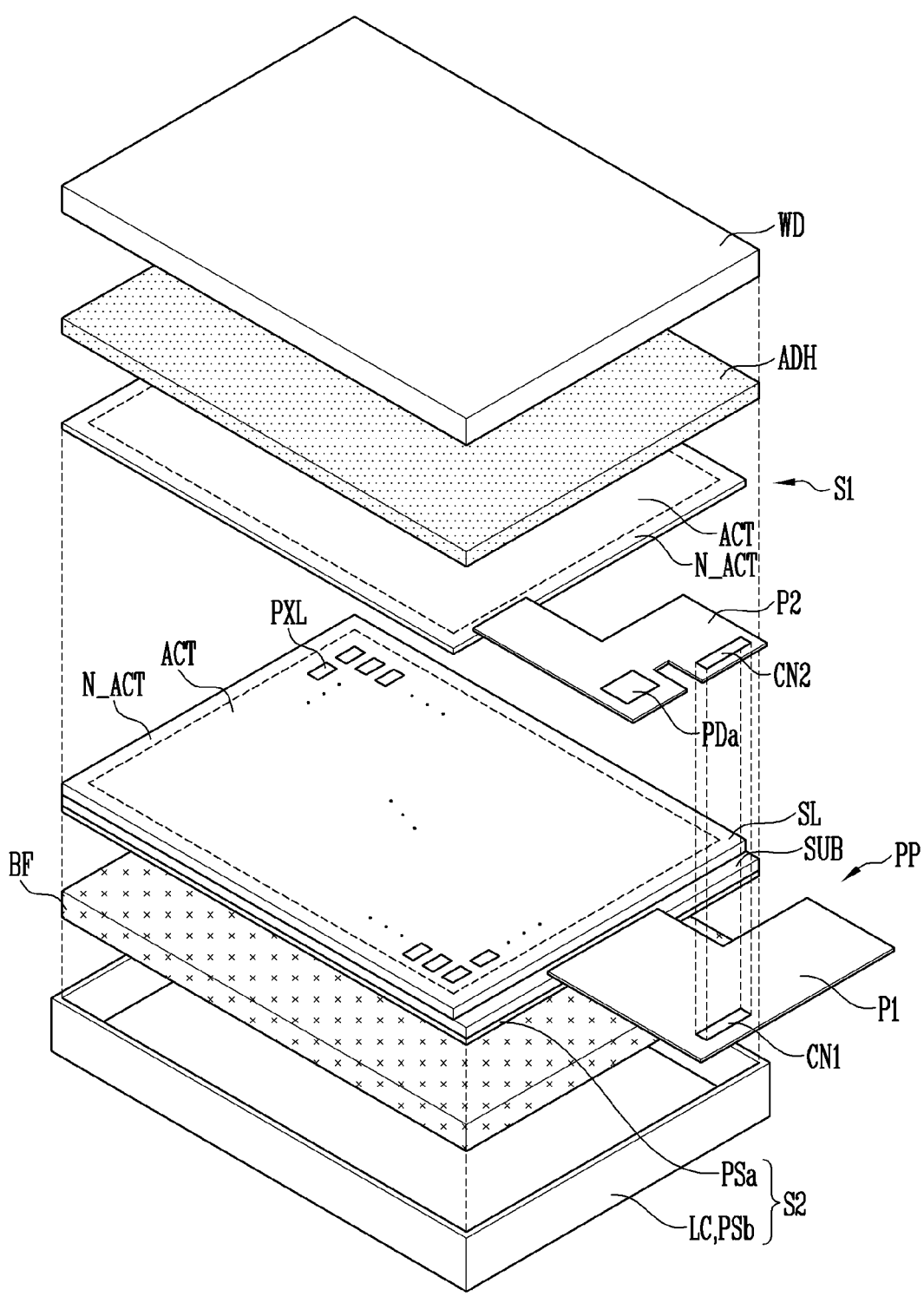
FIG. 7A is an exploded perspective view illustrating that the display device of FIG. 1 is specifically implemented.
Figure 7B:
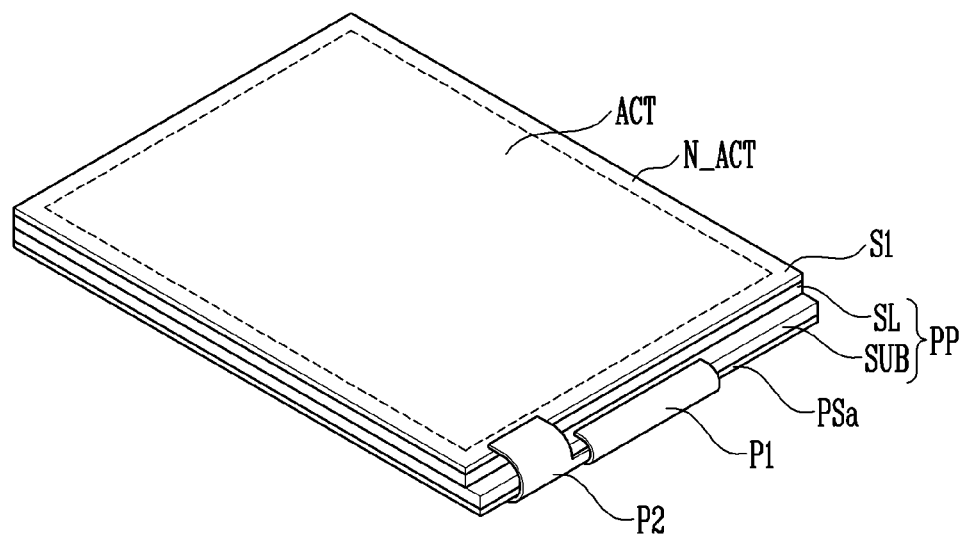
FIG. 7B is a perspective view illustrating that the display device of FIG. 1 is assembled.
Figure 8A:
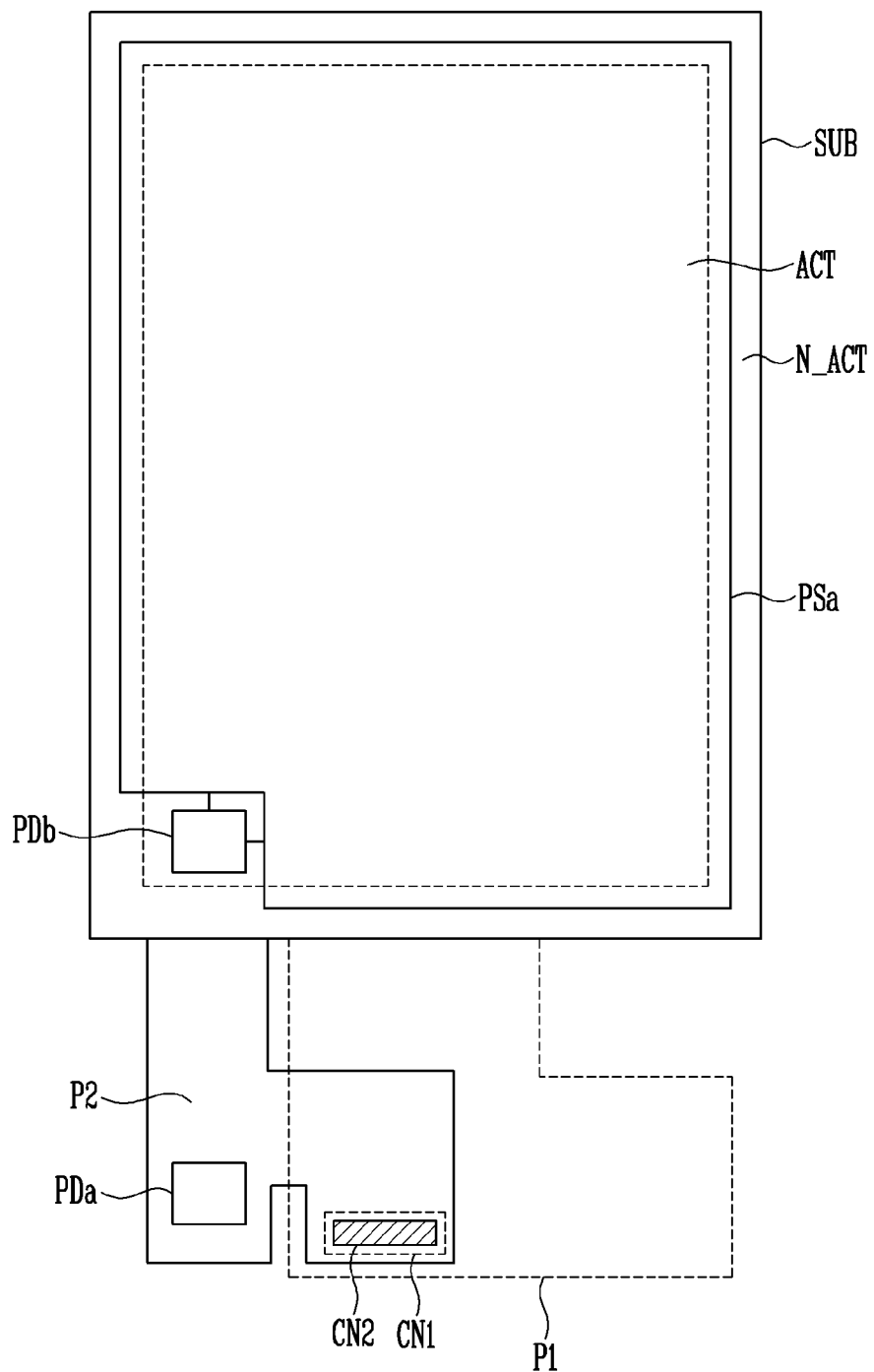
FIGS. 8A and 8B are plan views illustrating the display device of FIGS. 7A and 7B seen from a rear side.
Figure 8B:
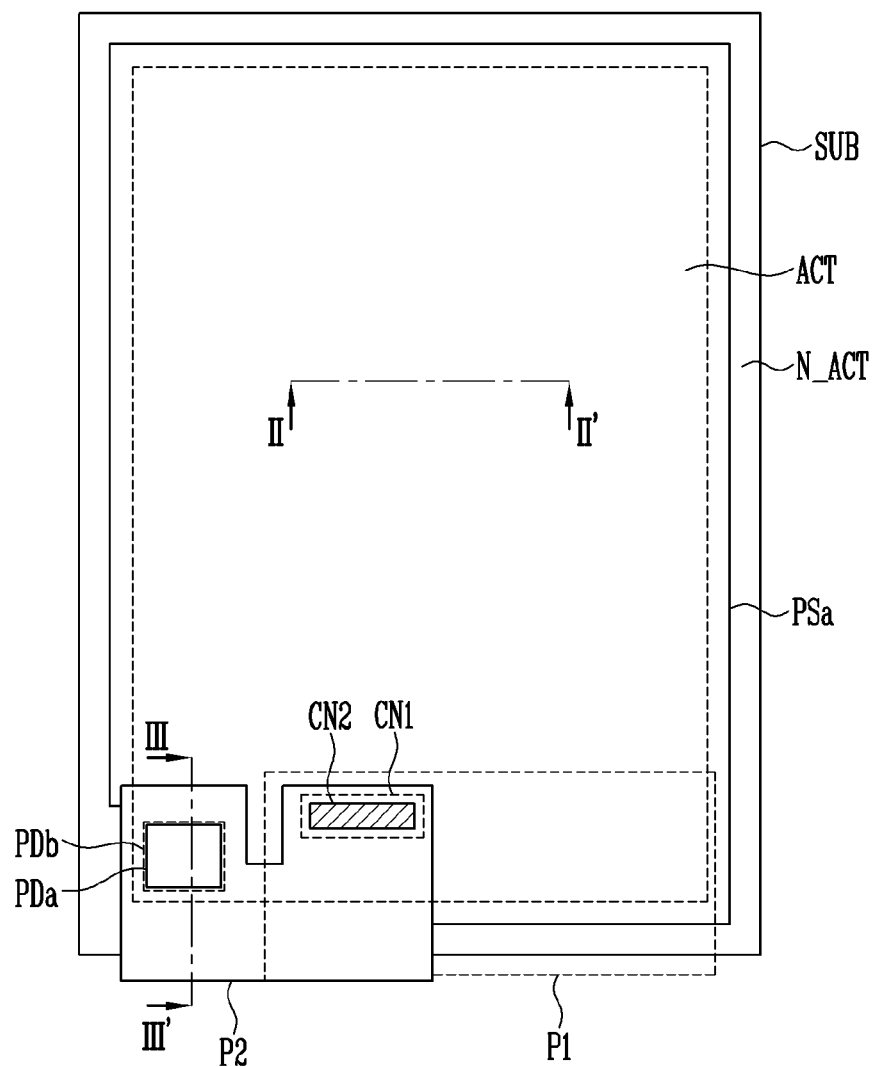

The display device having the above configuration may have one of various shapes. FIG. 7A is an exploded perspective view illustrating that the display device of FIG. 1 is specifically implemented and FIG. 7B is a perspective view illustrating that the display device of FIG. 1 is assembled. FIGS. 8A and 8B are plan views illustrating the display device of FIGS. 7A and 7B seen from a rear side.

In the above drawings, for convenience of description, some of the elements are exaggerated. In some drawings, partial elements, for example, a window WD and an adhesive layer ADH are omitted.

The display device according to an embodiment of the present disclosure includes the display panel PP, the first sensor S1 disposed on a front surface of the display panel PP, the window WD disposed on the first sensor S1 with the adhesive layer ADH interposed between the first sensor S1 and the window WD, the second sensor S2 disposed on the rear surface of the display panel PP, and a lower cover LC for accommodating the display panel PP.

The display panel PP displays an image. The display panel PP may include a substrate and pixels PXL provided on the substrate as described above. The pixels PXL for displaying an image may be organic light emitting elements, liquid crystal elements, electrowetting elements, or electrophoretic elements. However, the present disclosure is not limited thereto.

In a plan view, the display panel PP includes a display area ACT in which the pixels PXL are provided and the image is displayed and a non-display area N_ACT provided at at least one side of the display area ACT.

A main FPCB P1 is connected to the display panel PP. An additional PCB (not shown) may be further connected to the main FPCB P1 and a driving circuit for controlling image display may be provided in the main FPCB P1. The main FPCB P1 may be folded in a direction of the rear surface of the display panel PP by surrounding a side of the display panel PP.

The first sensor S1 is disposed on the front surface of the display panel PP. The first sensor S1 for sensing the touch position of the user may include an insulating substrate and sensing electrodes and wiring lines that are disposed on the insulating substrate. In this case, the adhesive layer may be further provided between the insulating substrate and the display panel PP and the display panel PP and the insulating substrate of the first sensor S may adhere to each other with the adhesive layer interposed therebetween. However, the first sensor S may be directly formed on the front surface of the display panel PP unlike in the drawings. For example, the first sensor S1 may be directly formed on an encapsulation substrate CPL of the display panel PP In this case, the sensing electrodes and the wiring lines may be printed on the encapsulation substrate CPL.

In a plan view, the first sensor S1 may include a touch active area corresponding to the display area ACT of the display panel PP and a touch inactive area corresponding to the non-display area N_ACT. Since the touch active area and the touch inactive area may respectively overlap the display area ACT and the non-display area N_ACT, in the drawings, the touch active area and the touch inactive area are respectively illustrated as the display area ACT and the non-display area N_ACT. The sensing electrodes of the first sensor S1 may be provided in the touch active area ACT and the wiring lines connected to the sensing electrodes of the first sensor S1 and the pad of the first sensor S1 connected to the ends of the wiring lines may be provided in the touch inactive area N_ACT.

The window WD is disposed on the first sensor S1 with the adhesive layer ADH interposed between the window WD and the first sensor S1. The window WD is disposed on the first sensor S1 of the display panel PP and protects the display panel PP. The window WD may be formed of a transparent insulating material such as glass or organic polymer. The window WD is formed to be larger than the display area ACT of the display panel PP or may be formed to have the same size as the display area ACT.

The adhesive layer ADH attaches the window WD to a lower element and buffers external impact. The adhesive layer ADH may be optically transparent adhesive layer and may be formed of acrylics polymer, ethylene vinyl acetate polymer, nitriles polymer, silicon rubbers, butyl rubbers, styrene block copolymers, vinyl ethers polymer, urethane polymer, or epoxy polymer. For example, the adhesive layer ADH is formed of urethane polymer or may be formed by adding rubber or acrylics polymer to urethane polymer.

The adhesive layer ADH may be formed so that a difference in thickness is minimized. There may exists a difference in thickness in the adhesive layer ADH in accordance with a thickness of the adhesive layer ADH during the formation of the adhesive layer ADH, a material of the adhesive layer ADH, and forming processes. In particular, in accordance with shapes of the display panel PP and the second sensor S2, a partial area of the adhesive layer ADH may be formed to be thick and another partial area of the adhesive layer ADH may be formed to be thin during the forming processes. At this time, when the thickness difference of the adhesive layer ADH is large, a shape of the adhesive layer ADH having the thickness difference may be recognized by the user. Therefore, in the display device according to an embodiment of the present disclosure, the thickness difference of the adhesive layer ADH is provided not to be recognized by the user. That is, the thickness difference between the thickest part and the thinnest part of the adhesive layer ADH is no more than 3 µm. According to an embodiment of the present disclosure, the thickness difference between the thickest part and the thinnest part of the adhesive layer ADH may be no more than 2.5 µm.

Although not shown, a polarizing layer may be disposed between the display panel PP and the window WD. The polarizing layer is plate-shaped and may be disposed on the front surface of the display panel PP, for example, on the first sensor S1. The polarizing layer may be attached onto the first sensor S1 with the adhesive interposed between the first sensor S1 and the polarizing layer. The polarizing layer may prevent external light from being reflected. According to an embodiment of the present disclosure, it is illustrated that the polarizing layer is provided. However, the present disclosure is not limited thereto. The polarizing layer may be replaced by another kind of optical film or the optical film may be further added. In addition, the polarizing layer may be directly provided on a top surface of another element in the form of a thin film.

The second sensor S2 is disposed on the rear surface of the display panel PP. The second sensor S2 for sensing the pressure of the touch of the user may include a first sensing electrode PSa disposed on the rear surface of the display panel PP, a second sensing electrode PSb separate from the first sensing electrode PSa, and a buffer member BF disposed between the first sensing electrode PSa and the second sensing electrode PSb.

The first sensing electrode PSa of the second sensor S2 is formed of conductive paste and is printed on the rear surface of the substrate SUB of the display panel PP. The first sensing electrode PSa of the second sensor S2 may have a mesh structure formed of the fine lines. A pad PDb is connected to the first sensing electrode PSa of the second sensor S2. At least a portion of the pad PDb of the second sensor S2 may overlap the display area ACT. Since the pad PDb of the second sensor S2 is disposed on the rear surface of the display panel PP, although the pad PDb of the second sensor S2 is provided in the display area ACT, it does not affect a quality of an image displayed.

The second sensing electrode PSb of the second sensor S2 may be arranged to be separate from the first sensing electrode PSa of the second sensor S2 with the buffer member BF interposed therebetween. The second sensing electrode PSb of the second sensor S2 may be replaced by the lower cover LC to be described later.

According to an embodiment of the present disclosure, a FPCB P2 is connected to the first sensor S1 and the second sensor S2. Wiring lines and circuits that form the sensor controller may be mounted in the FPCB P2. One end of the FPCB P2 is connected to the first sensor S1 and the other end of the FPCB P2 may be connected to the second sensor S2. Specifically, one end of the FPCB P2 is connected to the pads TRP of the first sensor S1 and the other end of the FPCB P2 may be connected to the pad PDb of the second sensor S2. Although not shown, the FPCB P2 may be connected to the pads TRP of the first sensor S1 by using an anisotropic conductive layer and may be connected to the pad PDb of the second sensor S2 by using an additional conductive adhesive member. Since the pads TRP of the first sensor S1 is disposed on the front surface of the display panel PP and the pad PDb of the second sensor S2 is disposed on the rear surface of the display panel PP, the FPCB P2 is folded in the direction of the rear surface of the display panel PP by surrounding the side of the display panel PP and may be connected to the pads TRP of the first sensor S1 and the pad PDb of the second sensor S2. In particular, a pad PDa connected to the pad PDb of the second sensor S2 is provided at the other end of the FPCB P2. In a state in which one end of the FPCB P2 is connected to the pads TRP of the first sensor S1, after the other end of the FPCB P2 is folded in the direction of the rear surface of the display panel PP, the pad PDa provided at the other end of the FPCB P2 and the pad PDb of the second sensor S2 are connected to each other. Therefore, the sensor controller is connected to the first sensor S1 and the second sensor S2 and may simultaneously or separately control the first sensor S1 and the second sensor S2.

According to an embodiment of the present disclosure, the main FPCB P1 and the FPCB P2 at least partially overlap and are connected to each other through connection pad s CN1 and CN2 in an overlapping area. The first connection pad CN1 and the second connection pad CN2 for connecting the main FPCB P1 and the FPCB P2 are respectively provided in the main FPCB P1 and the FPCB P2. The first connection pad CN1 and the second connection pad CN2 are provided in corresponding positions when the main FPCB P1 and the FPCB P2 overlap and may be connected to each other by a conductive member such as an anisotropic conductive film or a connector. According to an embodiment of the present disclosure, the main FPCB P1 and the FPCB P2 may be folded toward rear surfaces thereof in a state in which the main FPCB P1 and the FPCB P2 are connected to each other. Therefore, the information on the touch position and the touch pressure from the sensor controller may be provided to the display driver.

The lower cover LC accommodates upper elements including the display panel PP. The lower cover LC may have any shape capable of accommodating and supporting the display panel PP. The lower cover LC may be formed of a conductive material. In this case, the lower cover LC functions as the second sensing electrode PSb of the second sensor S2. When the lower cover LC is not formed of the conductive material, the second sensing electrode PSb may be additionally formed on the lower cover LC by metal plating.

The buffer member BF is disposed between the lower cover LC and the first sensing electrode PSa of the second sensor S2 or an air layer may be disposed between the lower cover LC and the first sensing electrode PSa of the second sensor S2 without an additional element.

Figure 9A:
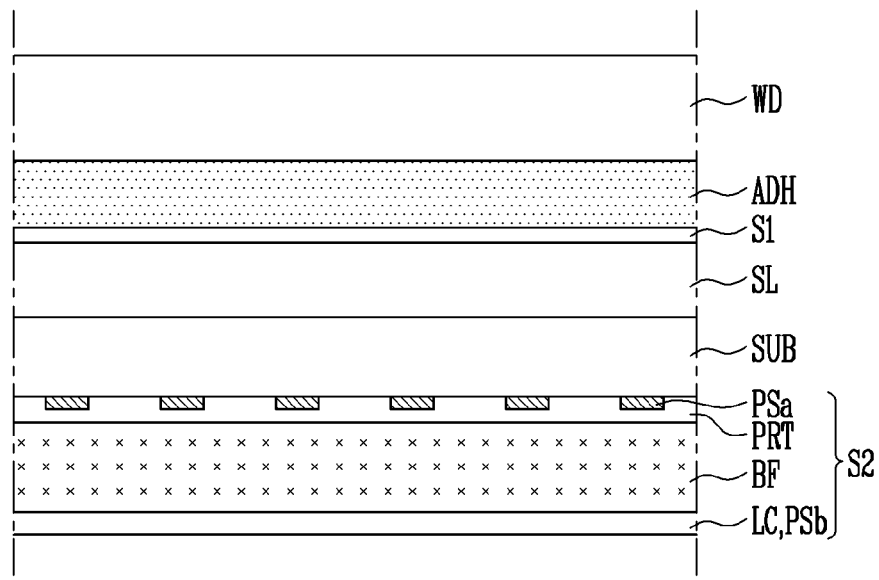
FIGS. 9A and 9B are cross-sectional views taken along the lines II-II' and III-III' of FIG. 8B.
Figure 9B:
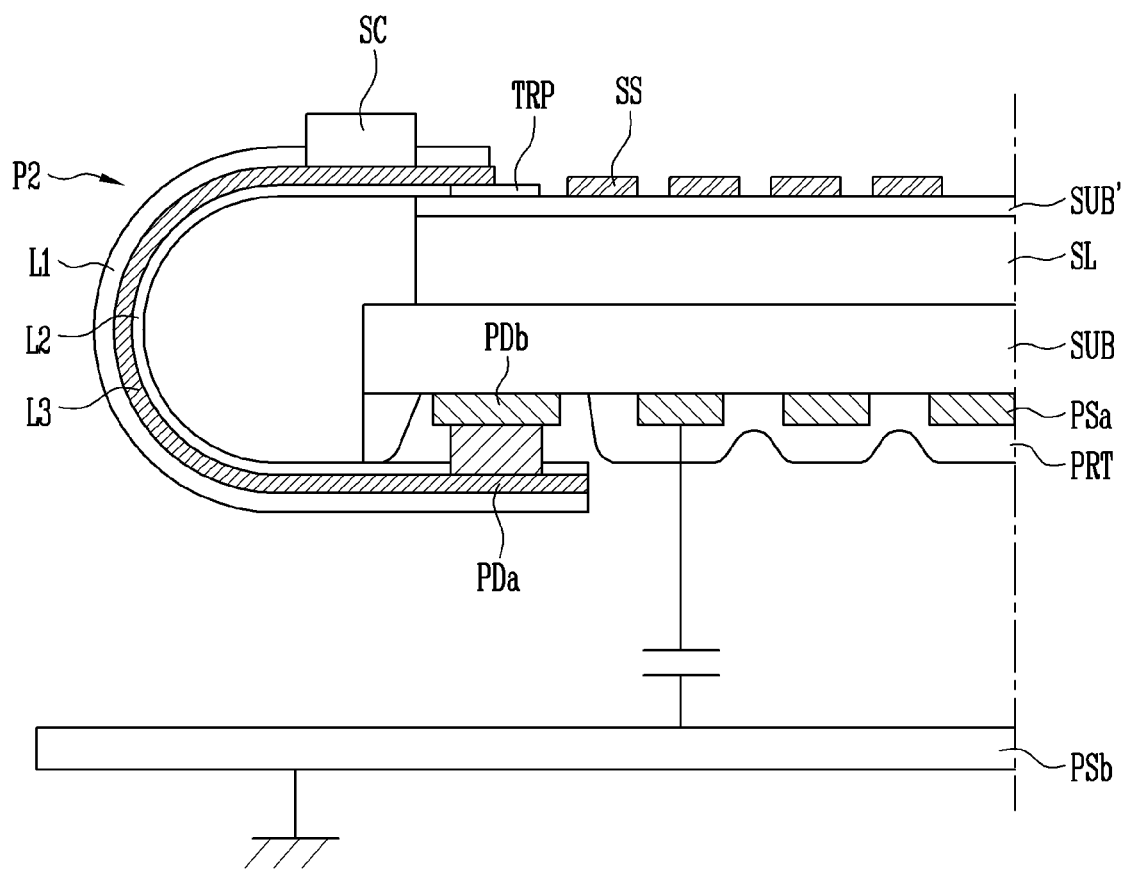

FIGS. 9A and 9B are cross-sectional views taken along the lines II-II' and III-III' of FIG. 8B. Hereinafter, referring to FIGS. 9A and 9B, a stacking relationship among the respective elements will be described as follows. In FIGS. 9A and 9B, for convenience of description, some of the respective elements are exaggerated and some elements are omitted.

Referring to FIG. 9A, the display device according to an embodiment of the present disclosure includes a lower cover LC, a buffer member BF, a protective layer PRT, a first sensing electrode PSa of a second sensor S2, a substrate SUB, a encapsulation substrate SL, a first sensor S1, an adhesive layer ADH, and a window WD that are stacked from a bottom to a top. Here, the lower cover LC functions as the second sensing electrode PSb of the second sensor S2. Although not shown, a plurality of pixels are provided between the substrate SUB and the encapsulation substrate SL. In addition, the polarizing layer may be further disposed between the first sensor S and the adhesive layer ADH or between the encapsulation substrate SL and the first sensor S1.

Referring to FIG. 9B, the first sensor S1 is disposed on the encapsulation substrate SL of the display panel PP. The first sensor S1 may include an additional insulating substrate SUB' and sensing electrodes SS and a pad TRP that are disposed on the insulating substrate SUB'. The FPCB P2 is connected to the pad TRP. A touch controller SC is mounted on the FPCB P2.

The first sensing electrode PSa and a pad PDb of the second sensor S2 are disposed on the rear surface of the substrate SUB of the display panel PP. The protective layer PRT is disposed on the first sensing electrode PSa of the second sensor S2. The protective layer PRT has an opening that exposes the pad PDb.

The protective layer PRT for protecting the first sensing electrode PSa is formed of a printable insulating material. The protective layer PRT may be formed of, for example, polymeric resin. Specifically, the protective layer PRT may be a thin film formed of synthetic resin. For example, the protective layer PRT may include at least one among thermoplastic elastomer, polystyrene, polyolefin, polyurethane thermoplastic elastomers, polyamides, synthetic rubbers, polydimethylsiloxane, polybutadiene, polyisobutylene, [poly(styrene-butadienestyrene)], polyurethanes, polychloroprene, polyethylene, silicon, and combinations of the above materials. However, the present disclosure is not limited thereto.

The FPCB P2 is for electrically connecting the touch controller SC and the first sensor S1 and the second sensor S2. The FPCB P2 formed of an entirely or partially flexible material is bent along one side of the display panel PP and electrically connects the first sensor S1 disposed on the front surface of the display panel PP and the second sensor S2 disposed on the rear surface of the display panel PP.

The FPCB P2 includes a conductive layer L3 and a first layer L1 and a second layer L2 that protect the conductive layer L3 on both surfaces of the conductive layer L3. The first layer L1 and the second layer L2 include an insulating material and the conductive layer L3 includes a conductive material such as metal.

One end of the conductive layer L3 is attached to the pad TRP of the first sensor S1 and the other end of the conductive layer L3 is attached to the pad PDb of the second sensor S2 through a conductive member. At this time, the other end of the FPCB P2 has an opening obtained by partially removing the second layer L2 so that a portion of the conductive layer L3 is exposed. The exposed portion of the conductive layer L3 is connected to the pad PDb which is connected to the first sensing electrode PSa of the second sensor S2 through the conductive member.

Figure 10:
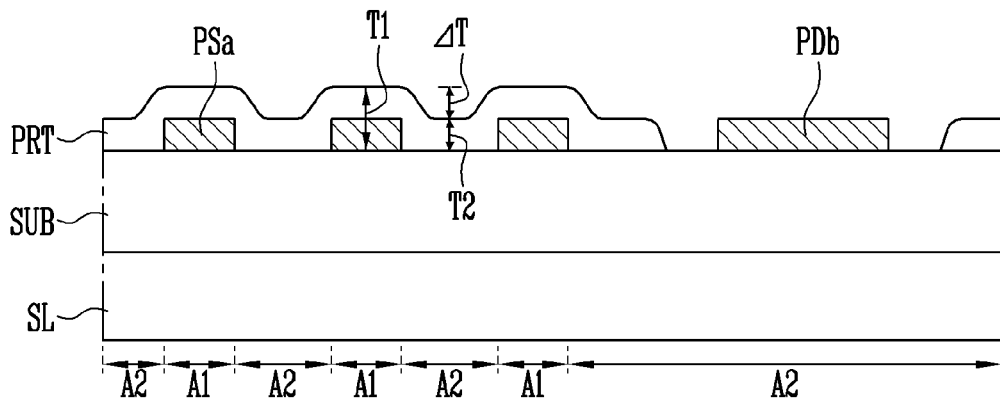
FIG. 10 is a cross-sectional view illustrating a first sensing electrode of a second sensor and a protective layer that are stacked on a display panel.

FIG. 10 is a cross-sectional view illustrating the first sensing electrode PSa of the second sensor S2 and the protective layer PRT that are stacked on the display panel PP. In FIG. 10, for convenience of description, the rear surface of the substrate SUB is illustrated as being positioned on the top.

Referring to FIG. 10, a first sensing electrode PSa of a second sensor S2 is disposed on a rear surface of a substrate SUB.

A protective layer PRT is disposed on the first sensing electrode PSa of the second sensor S2. The protective layer PRT is disposed on the first sensing electrode PSa to a predetermined thickness. Since the protective layer PRT is disposed on an entire surface of the first sensing electrode PSa to an actually uniform thickness, a top surface of the protective layer PRT may have a topology in accordance with a pattern of the first sensing electrode PSa. Therefore, when, in the substrate SUB, a portion in which the first sensing electrode PSa is provided is referred to as a first area A1 and a portion in which the first sensing electrode PSa is not provided is referred to as a second area A2, a height from the rear surface of the substrate SUB to a top surface of the first area A1 is large and a height from the rear surface of the substrate SUB to a top surface of the second area A2 is small.

For example, when a height of the first area A1 from the rear surface of the substrate SUB to the top surface of the protective layer PRT is referred to as a first height T1 and when a height of the second area A2 from the rear surface of the substrate SUB to the top surface of the protective layer PRT is referred to as a second height T2, a difference $\Delta T$ between the first height T1 and the second height T2 is equal to or similar to a thickness of the first sensing electrode PSa.

When the difference $\Delta T$ between the first height T1 and the second height T2 is excessively large, the position of the first sensing electrode PSa may be recognized by the user due to a difference in height of the protective layer PRT, that is, the difference of the first height T1 and the second height T2 or due to a difference in thickness of another element that is caused by the difference in height of the protective layer PRT. For example, when the difference in height of the protective layer PRT is excessively large, in display device manufacturing processes, a difference in thickness of the adhesive layer may be caused and a predetermined pattern may be recognized by the user due to the difference in thickness of the adhesive layer, which will be described later in the display device manufacturing processes.

According to the embodiment of the present disclosure, in order to prevent the predetermined pattern from being recognized by the user, the difference $\Delta T$ between the first height T1 and the second height T2 may be set to be in a range in which the predetermined pattern is not recognized by the user. According to an embodiment of the present disclosure, the difference $\Delta T$ between the first height T1 and the second height T2 may be from about 1 μm to about 13 μm. According to another embodiment of the present disclosure, the difference $\Delta T$ between the first height T1 and the second height T2 may be from about 2.4 μm to about 10.7 μm.

According to an embodiment of the present disclosure, the first sensing electrode PSa of the second sensor S2 may have one of various shapes as long as a difference in height (hereinafter, referred to as "step difference") between a convex portion and a concave portion is not recognized by the user. FIGS. 11A through 11F are cross-sectional views illustrating shapes of the first sensing electrode PSa of the second sensor S2 according to embodiments of the present disclosure.

Figure 11A:
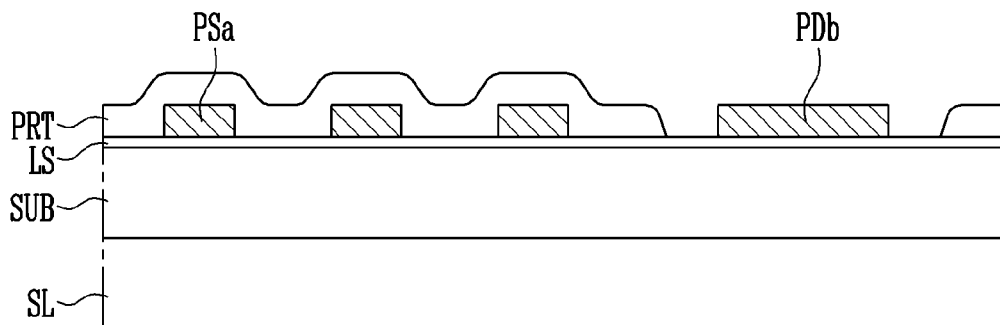
FIGS. 11A, 11B, 11C, 11D, 11E and 11F are cross-sectional views illustrating shapes of a first sensing electrode of a second sensor according to embodiments of the present disclosure.

Referring to FIG. 11A, a display device according to an embodiment of the present disclosure may further include a light blocking layer LS for preventing external light from being reflected at an interface between a substrate SUB and a first sensing electrode PSa of a second sensor S2. As illustrated in FIG. 11A, the light blocking layer LS may be disposed on an entire surface of the rear surface of the substrate SUB.

Figure 11B:
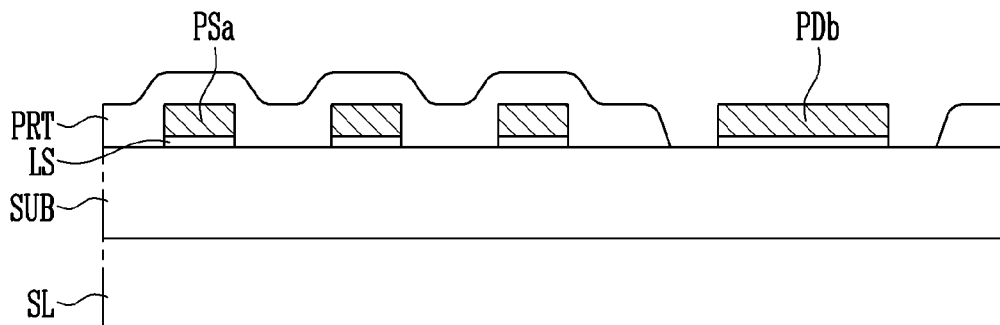

As illustrated in FIG. 11B, the light shielding layer LS may be arranged to correspond to the first sensing electrode PSa of the second sensor S2. In this case, the first sensing electrode PSa of the second sensor S2 and the light blocking layer LS may have the same shape and may completely overlap each other in a plan view.

Figure 11C:
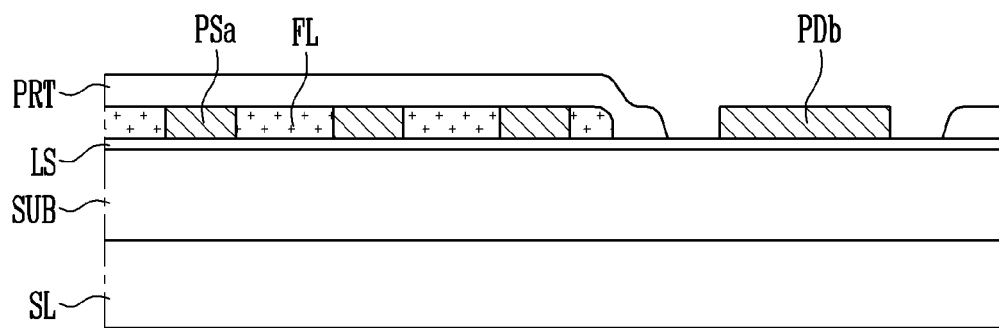
Figure 11D:
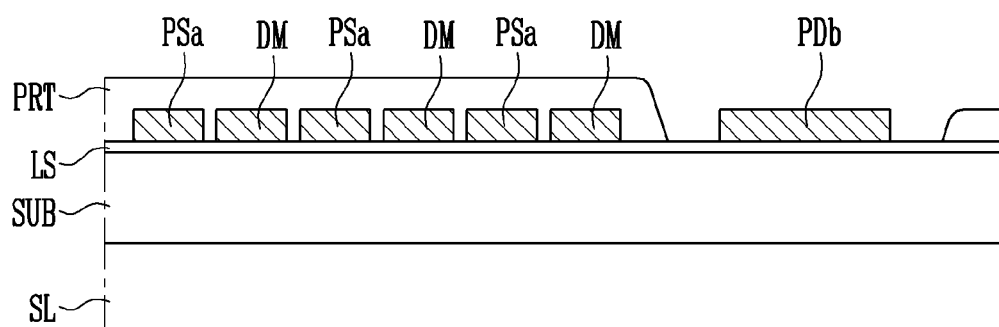

Referring to FIGS. 11C and 11D, a display device according to an embodiment of the present disclosure may further include an element for minimizing step difference in the top surface of a protective layer PRT.

Referring to FIG. 11C, a filling layer FL arranged in a position in which the first sensing electrode PSa of the second sensor S2 is not provided may be formed. The filling layer FL includes an insulating material and has a height corresponding to a height of the first sensing electrode PSa to fill portions in which the first sensing electrode PSa is not formed. Therefore, an area in which the first sensing electrode PSa is provided and an area in which the first sensing electrode PSa is not provided have the same height. When the protective layer PRT is formed on the first sensing electrode PSa, the step difference does not exist or is minimized in the top surface of the protective layer PRT.

Referring to FIG. 11D, a dummy electrode DM may be formed between adjacent first sensing electrodes PSa. The dummy electrode DM is electrically disconnected from the first sensing electrode PSa, for example, the dummy electrode is in a floating state. Therefore, the dummy electrode DM fills the gap between the adjacent first sensing electrodes PSa in which the first sensing electrode PSa is not provided without affecting the first sensing electrode PSa. Therefore, when the protective layer PRT is formed on the first sensing electrode PSa, the step difference does not exist or is minimized in the top surface of the protective layer PRT.

Figure 11E:
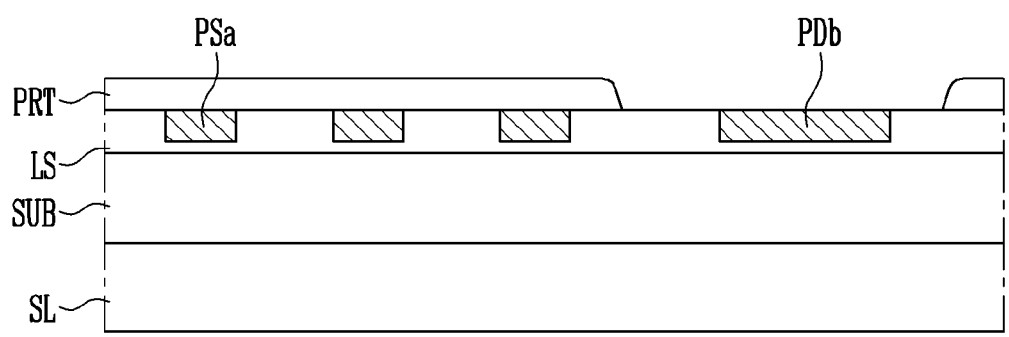

Referring to FIG. 11E, in order to minimize the step difference in the top surface of the first sensing electrode PSa, the first sensing electrode PSa may be provided so that the top surface of the first sensing electrode PSa and a top surface of the light blocking layer LS actually coincide with each other. In this case, the light blocking layer LS may be formed to be thicker than in the other embodiments and the first sensing electrode PSa is printed into the semi-hardened light blocking layer LS by pressing the first sensing electrode PSa from the top surface thereof so that the first sensing electrode PSa of FIG. 11E may be formed. According to the embodiment, since the top surface of the first sensing electrode PSa and the top surface of the light blocking layer LS actually coincide with each other or are slightly different, the step difference in the top surface of the protective layer PRT is minimized.

Figure 11F:
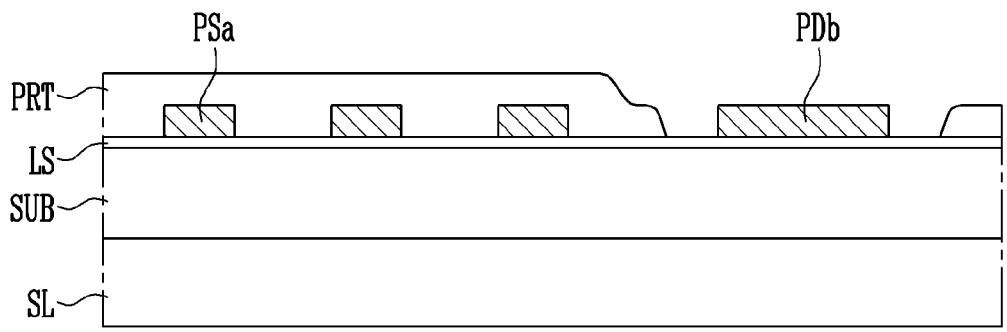

Referring to FIG. 11F, the step difference of the protective layer PRT in the top surface of the first sensing electrode PSa may be removed by physically polishing the top surface of the protective layer PRT. In this case, a physical polishing process is added. However, since the step difference in the top surface of the protective layer PRT may be actually removed, it is possible to prevent the predetermined pattern from being recognized by the user due to the step difference in the top surface of the protective layer PRT.

Since the display device having the above-described structure may sense the position and pressure of the touch and the second sensor S2 for sensing the pressure is formed on the rear surface of the display panel PP without the additional substrate SUB by the printing method, a thin display device may be implemented.

Figure 12:
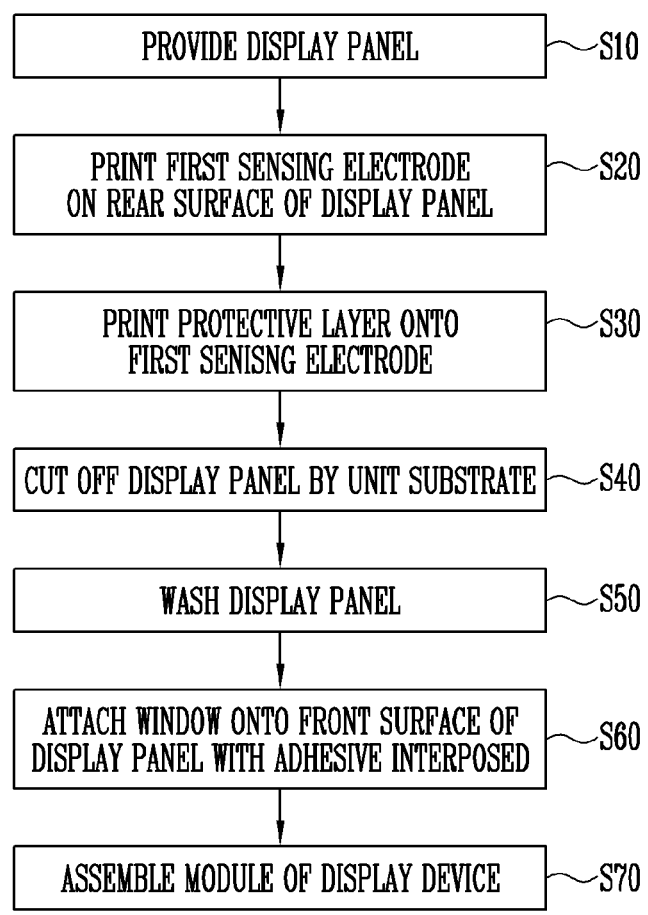
FIG. 12 is a flowchart illustrating a method of manufacturing a display device according to an embodiment of the present disclosure.

The above-described display device may be manufactured by the following method. FIG. 12 is a flowchart illustrating a method of manufacturing a display device according to an embodiment of the present disclosure. FIGS. 13A through 13E are cross-sectional views sequentially illustrating some processes of a method of manufacturing a display device according to an embodiment of the present disclosure. Hereinafter, in the drawings, for convenience of description, some elements (for example, the pixels and the first sensor) are omitted.

First, referring to FIG. 12, a display device according to an embodiment of the present disclosure may be manufactured by providing a display panel in operation S10, printing a first sensing electrode on the rear surface of the display panel in operation S20, printing a protective layer on the first sensing electrode in operation S30, cutting off the display panel by unit substrate in operation S40, washing the display panel in operation S50, attaching a window to the front surface of the display panel with an adhesive layer interposed between the window and the display panel in operation S60, and assembling a lower cover LC and a module of the display device in operation S70.

Figure 13A:
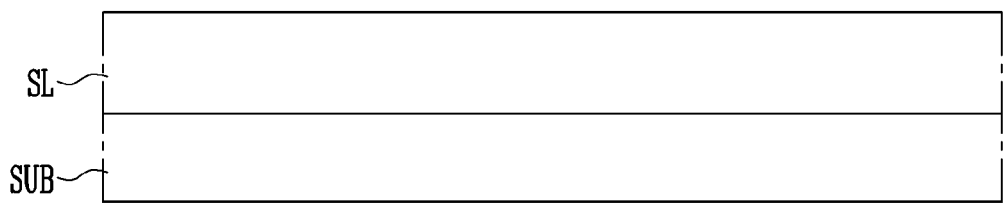
FIGS. 13A, 13B, 13C, 13D and 13E are cross-sectional views sequentially illustrating some processes of a method of manufacturing a display device according to an embodiment of the present disclosure.

Referring to FIG. 13A, the display panel is provided. The display panel may be provided by forming pixels and an encapsulation layer SL on a substrate SUB. The pixels may be formed by using various processes, for example, a plurality of deposition and/or photolithography processes.

Figure 13B:
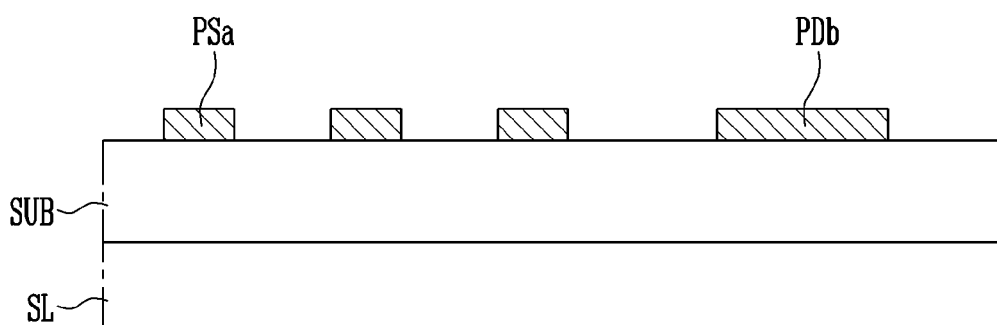

Referring to FIG. 13B, a first sensing electrode PSa of the second sensor S2 is formed on the rear surface of the substrate SUB. The first sensing electrode PSa of the second sensor S2 may be printed onto the rear surface of the substrate SUB. Since the first sensing electrode PSa is formed by the printing method, the first sensing electrode PSa may be easily formed without satisfying a specific condition such as a low temperature or low pressure unlike in the photolithography process or the deposition process.

The first sensing electrode PSa is formed of easily printable conductive paste with predetermined viscosity. The conductive paste may include a solvent and a solid material. The solid material of the conductive paste is left after the solvent is removed and may function as an electrode. As described above, the first sensing electrode PSa may be formed of at least one among metal paste, metal oxide paste, conductive carbon paste, and conductive polymeric paste.

According to an embodiment of the present disclosure, the first sensing electrode PSa may be formed by a screen printing method. However, any method by which the first sensing electrode PSa may be formed of liquid with predetermined viscosity may be used and the first sensing electrode PSa may be formed by another kind of printing or coating method.

Figure 13C:
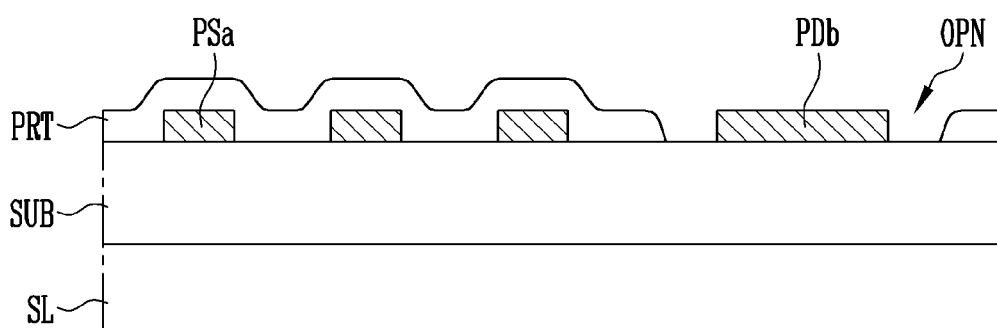

Referring to FIG. 13C, a protective layer PRT is formed on the rear surface of the substrate SUB on which the first sensing electrode PSa of the second sensor S2 is formed. Here, the protective layer PRT completely covers the first sensing electrode PSa of the second sensor S2 and is not formed on a pad PDb. An opening OPN is formed in the protective layer PRT in an area in which the pad PDb is formed so that the pad PDb may be connected to a flexible printed circuit board.

The protective layer PRT may be also printed onto the rear surface of the substrate SUB. Since the protective layer PRT is formed by the printing method, the protective layer PRT may be easily formed without satisfying a specific condition such as a low temperature or low pressure unlike in a common deposition process.

The protective layer PRT may be formed of an easily printable material, for example, semi-hardened or non-hardened polymeric resin with predetermined viscosity. The semi-hardened or non-hardened polymeric resin may become the protective layer PRT after being hardened.

The protective layer PRT may be formed by the screen printing method. However, any method by which the protective layer PRT may be formed of liquid with predetermined viscosity may be used and the protective layer PRT may be formed by another kind of printing or coating method.

Figure 13D:
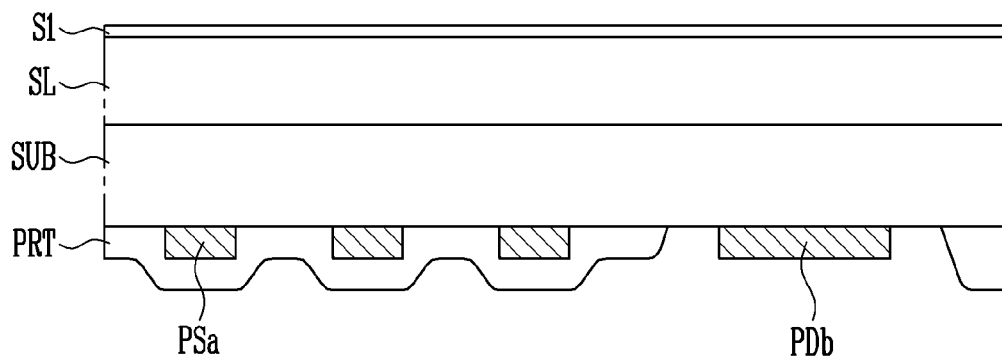

Referring to FIG. 13D, a first sensor S1 is formed on the front surface of the display panel. The first sensor S1 may be manufactured by forming sensing electrodes and wiring lines on an additional insulating substrate or by directly forming the sensing electrodes and the wiring lines on the encapsulation substrate SL. The sensing electrodes and the wiring lines of the first sensor S may be formed by using various processes including at least one photolithography process. The sensing electrodes and the wiring lines of the first sensor S1 may be formed by using the printing method or the coating method other than the photolithography process.

Next, although not shown, the display panel in which the first sensor S1 is formed is cut into unit substrates. When only one display panel is formed from one mother substrate, unnecessary portions of the mother substrate is cut off and when a plurality of display panels are simultaneously formed from one mother substrate, a plurality of separated display panels are obtained.

Here, the unit substrate means one display panel for manufacturing one display device. According to the above-described embodiment, it is illustrated that only one display panel is formed from one substrate. However, the present disclosure is not limited thereto. In general, after simultaneously forming a plurality of display panels on one mother substrate, each unit substrate corresponding to one display device may be obtained. The display panel cut off by unit substrate is washed.

Figure 13E:
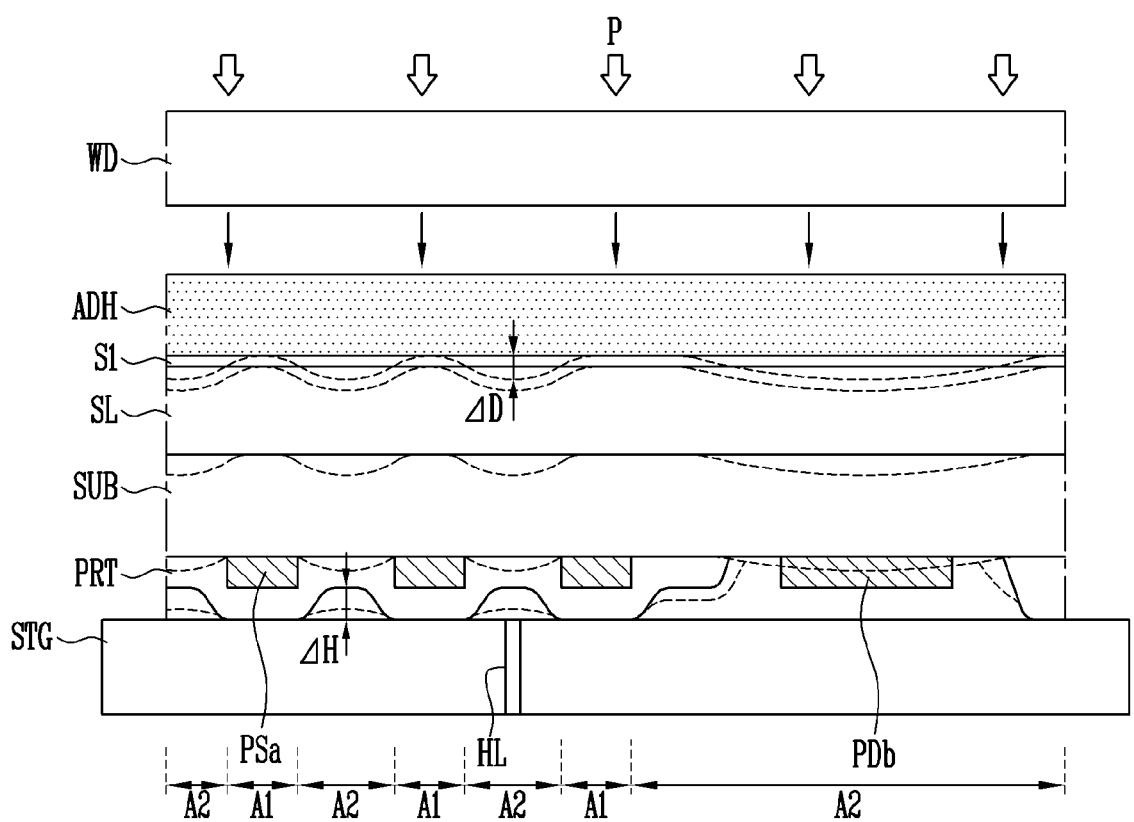

Next, referring to FIG. 13E, a window WD is attached onto the front surface of the display panel on which the first sensor S1 is formed with an adhesive layer ADH. The adhesive layer ADH may be coated by using a slit coating method and the window WD may be attached onto the adhesive layer ADH by a laminating method.

In order to attach the window WD on the front surface of the display panel, the display panel is fixed on a stage STG having vacuum chuck. A vacuum chuck is provided in the stage STG and air between the display panel and the stage STG is absorbed through a plurality of vacuum holes HL that is formed through the stage to pass through a top surface and a bottom surface of the stage STG. Therefore, the display panel is fixed to the stage STG.

In a process in which the adhesive layer ADH is arranged on the top surface of the display panel and the window WD is attached onto the adhesive layer ADH by the laminating method, elements under the window WD are partially curved. In FIG. 13E, it is simply illustrated by dotted lines that the display panel is curved during a laminating process.

The display panel is curved when the window WD is attached by the laminating method since pressure P is applied to the window WD in a predetermined direction. For example, when a direction of a rear surface of the window WD, that is, a direction from the window WD toward the substrate SUB is referred to as a first direction D1, in the laminating process, the pressure P is applied to the window WD and the elements under the window WD in the first direction D1.

At this time, the height difference ΔT (refer to FIG. 10) caused by the first sensing electrode PSa of the second sensor S2 and the protective layer PRT formed on the first sensing electrode PSa may exist in the bottom of the display panel fixed on the stage STG. Due to the height difference ΔT, an empty space is formed between the protective layer PRT and the stage STG along an area approximately corresponding to the second area A2. As a result, when the pressure P is applied in the first direction D1, due to the pressure P applied to the empty space, the protective layer PRT becomes curved to a predetermined degree ΔH along the second area A2 in the first direction D1. Therefore, the substrate SUB, the encapsulation substrate SL, and the adhesive layer ADH become sequentially or simultaneously curved along the second area A2 in the first direction D1.

Here, during the laminating process, the adhesive layer ADH is hardened so that the window WD is attached onto the encapsulation substrate SL. Since the window WD has a fixed shape and smaller flexibility than the other elements, a thickness of the window WD changes to a smaller degree while being curved. Since the adhesive layer ADH has larger flexibility than the window WD, a thickness of the adhesive layer ADH may easily change. Therefore, curved portions of the encapsulation substrate are filled with the adhesive layer due to the pressure P applied to the window WD. On the other hand, a top surface of the adhesive layer ADH is flat due to the pressure caused by the window WD formed thereon. As a result, the adhesive layer ADH is thicker in a portion in which the display panel is curved than in a portion in which the display panel is not curved. Here, a portion in which the display panel is not curved in a lower direction corresponds to an area in which the first sensing electrode PSa is provided, that is, the first area A1 and a portion in which the display panel is curved in the lower direction corresponds to an area in which the first sensing electrode PSa is not provided, that is, the second area A2. Therefore, a thickness of the adhesive layer ADH in the first area A1 becomes different from a thickness of the adhesive layer ADH in the second area A2. That is, the adhesive layer ADH has convex portions in the first direction D1 to correspond to the second area A2 and the thickness of the adhesive layer ADH in the second area A2 may be larger than the thickness of the adhesive layer ADH in the first area A1. A difference in thickness ΔD between the first area A1 and the second area A2 of the adhesive layer ADH may be smaller than the height difference (ΔT of FIG. 10) in the surface of the protective layer PRT.

Here, when the difference in thickness ΔD between the first area A1 and the second area A2 of the adhesive layer ADH is large, a shape of the adhesive layer ADH may be recognized by the user due to the thickness difference ΔD. Therefore, in the display device according to an embodiment of the present disclosure, the thickness difference ΔD of the adhesive layer ADH is not recognized by the user. That is, the thickness difference between the thickest portion and the thinnest portion of the adhesive layer ADH is no more than 3 μm. According to an embodiment of the present disclosure, the thickness difference ΔD between the thickest portion and the thinnest portion of the adhesive layer ADH may be no more than 2.5 μm.

According to another embodiment of the present disclosure, in order to minimize the thickness difference ΔD of the adhesive layer ADH, various methods may be performed. For example, as illustrated in FIG. 11C, after forming the first sensing electrode PSa and additionally forming the filling layer FL, the protective layer PRT may be formed. In addition, as illustrated in FIG. 11D, after forming the first sensing electrode PSa and the dummy electrode DM together, the protective layer PRT may be formed. As illustrated in FIG. 11E, the top surface of the light blocking layer LS and the top surface of the first sensing electrode PSa may be controlled by forming the light blocking layer LS first and then, forming the first sensing electrode PSa on the light blocking layer LS by a pressure printing method. As illustrated in FIG. 11F, after forming the first sensing electrode PSa and the protective layer PRT, the protective layer PRT is polished so that the height difference of the protective layer PRT may be reduced.

Although not shown, before attaching the window WD, a polarizing layer may be formed on the first sensing electrode S1.

Next, the window WD is assembled with the other elements such as the buffer member and the lower cover so that the final display device is completed.

By the above-described method, the display device having the touch sensor and the pressure sensor may be simply provided. In the above-described display device, the step differences of the protective layer and the adhesive layer are minimized so that it is possible to prevent the pattern corresponding to the first sensing electrode of the sensor from being recognized by the user.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a display panel for displaying an image on a front surface thereof;
   a pressure sensor disposed on a rear surface of the display panel to sense touch pressure of a user;
   a position sensor disposed on the front surface of the display panel to sense a touch position; and
   a flexible printed circuit board (FPCB) having one end connected to the pressure sensor and the other end connected to the position sensor,
   wherein the pressure sensor comprises a first sensing electrode and a second sensing electrode insulated from each other to form capacitance,
   wherein the first sensing electrode is directly printed onto the rear surface of the display panel using conductive paste,
   wherein the pressure sensor further comprises a pad disposed on the rear surface of the display panel and connected to the sensing electrode, and
   wherein the pad is connected to the other end of the FPCB through a conductive adhesive member.

2. The display device of claim 1, wherein the pressure sensor further comprises a protective layer printed onto the first sensing electrode.

3. The display device of claim 2, wherein a thickness of the protective layer on the first sensing electrode is equal to or less than a thickness of the first sensing electrode.

4. The display device of claim 3, further comprising:
   a window disposed on a front surface of the display panel; and
   an adhesive layer disposed between the display panel and the window.

5. The display device of claim 4, wherein the adhesive layer is convex in a first direction to correspond to a second area.

6. The display device of claim 5, wherein the display panel comprises a first area in which the first sensing electrode is disposed and the second area in which the first sensing electrode is not disposed, and
   wherein the adhesive layer has different thicknesses in the first area and the second area.

7. The display device of claim 6, wherein the thickness of the adhesive layer in the second area is larger than the thickness of the adhesive layer in the first area.

8. The display device of claim 1, wherein the second sensing electrode is a lower cover that accommodates the display panel.

9. The display device of claim 8, further comprising a buffer member disposed between the first sensing electrode and the lower cover.

10. The display device of claim 1, wherein the position sensor comprises sensing electrodes disposed on the front surface of the display panel and a wiring line connected to the sensing electrodes.

11. The display device of claim 10,
    wherein the display panel comprises a display area in which an image is displayed and a non-display area provided at least at one side of the display area, and
    wherein, in a plan view, at least a portion of the pad overlaps the display area.

12. The display device of claim 10, further comprising a main FPCB connected to the display panel,
    wherein the main FPCB and the FPCB are connected to each other.

13. The display device of claim 1,
    wherein the display panel comprises a substrate and pixels arranged on the substrate.

14. The display device of claim 13, further comprising a light blocking layer disposed between the substrate and the first sensing electrode to prevent external light from being reflected.

15. The display device of claim 14, wherein the light blocking layer is disposed on an entire surface of the rear surface of the display panel.

16. The display device of claim 14, wherein the light blocking layer is disposed in a position in which the first sensing electrode is provided.

17. The display device of claim 13, further comprising a filling layer disposed in a position in which the first sensing electrode is not provided.

18. The display device of claim 13, further comprising a dummy pattern that is disposed in a position in which the first sensing electrode is not provided, that is formed of the same material as the first sensing electrode, and that electrically floats.

19. The display device of claim 1, wherein the first sensing electrode comprises at least one among metal paste, metal oxide paste, conductive carbon paste, and conductive polymeric paste.

20. The display device of claim 19, wherein the metal paste comprises at least one among silver (Ag), copper (Cu), and nickel (Ni), and
    wherein the metal oxide paste comprises at least one among zinc oxide (ZnO), tin oxide (SnO), and indium oxide (InO), the conductive carbon paste comprises at least one among graphite, carbon fiber, carbon nano-fiber, carbon nano-tube, and graphene, and the conductive polymer is polythiophene-based polymer or polypyrole-based polymer.

21. The display device of claim 1, wherein the first sensing electrode is mesh-shaped in a plan view.

22. The display device of claim 1, wherein the first sensing electrode comprises a first sub-electrode and a second sub-electrode provided in different areas.

23. A method of manufacturing a display device, the method comprising:
providing a display panel;
directly printing a first sensing electrode onto a rear surface of the display panel using conductive paste;
printing a protective layer onto the first sensing electrode; and
accommodating the display panel in a lower cover,
wherein the display device comprises:
the display panel for displaying an image on a front surface thereof;
a pressure sensor disposed on a rear surface of the display panel to sense touch pressure of a user;
a position sensor disposed on the front surface of the display panel to sense a touch position; and
a flexible printed circuit board (FPCB) having one end connected to the pressure sensor and the other end connected to the position sensor,
wherein the pressure sensor comprises a first sensing electrode and a second sensing electrode insulated from each other to form capacitance,
wherein the first sensing electrode is directly printed onto the rear surface of the display panel using conductive paste,
wherein the pressure sensor further comprises a pad disposed on the rear surface of the display panel and connected to the sensing electrode, and
wherein the pad is connected to the other end of the FPCB through a conductive adhesive member.

24. The method of claim 23, further comprising, after printing the protective layer, attaching a window onto the front surface of the display panel with an adhesive layer interposed between the display panel and the window.

25. The method of claim 24, further comprising:
cutting of the display panel to which the window is attached by a unit substrate; and
assembling a lower cover with the cut display panel.

26. The method of claim 23, further comprising printing a light blocking layer between the rear surface of the display panel and the sensing electrode.

27. The method of claim 26, further comprising pressing and printing the sensing electrode onto the light blocking layer.

28. The method of claim 26, further comprising forming a filling layer in an area in which the sensing electrode is not formed.

29. The method of claim 23, further comprising polishing the protective layer.

* * * * *